United States Patent
Kodama et al.

[11] Patent Number: 5,891,603
[45] Date of Patent: Apr. 6, 1999

[54] POSITIVE WORKING PHOTOSENSITIVE COMPOSITION

[75] Inventors: Kunihiko Kodama; Toshiaki Aoai; Kazuya Uenishi, all of Shizuoka, Japan

[73] Assignee: Fuji Photo Film Co., Ltd., Kanagawa, Japan

[21] Appl. No.: 840,629

[22] Filed: Apr. 25, 1997

[30] Foreign Application Priority Data

| Apr. 25, 1996 | [JP] | Japan | 8-105635 |
| Jul. 1, 1996 | [JP] | Japan | 8-171327 |
| Apr. 18, 1997 | [JP] | Japan | 9-101924 |

[51] Int. Cl.⁶ .................................. G03F 7/004
[52] U.S. Cl. ............. 430/270.1; 430/905; 430/920; 430/924; 522/31
[58] Field of Search ............. 430/270.1, 905, 430/920, 924; 522/31

[56] References Cited

U.S. PATENT DOCUMENTS

| 5,272,042 | 12/1993 | Allen et al. | 430/270.1 |
| 5,585,218 | 12/1996 | Nakano et al. | 430/270.1 |
| 5,707,776 | 1/1998 | Kawabe et al. | 430/270.1 |

FOREIGN PATENT DOCUMENTS

| 0540032 | 5/1993 | European Pat. Off. |
| 0708368 | 4/1996 | European Pat. Off. |
| 0747768 | 12/1996 | European Pat. Off. |
| 0762207 | 3/1997 | European Pat. Off. |
| 4410441 | 9/1994 | Germany |
| 3206458 | 9/1991 | Japan |
| 5249682 | 9/1993 | Japan |
| 7140666 | 6/1995 | Japan |

*Primary Examiner*—John S. Chu
*Attorney, Agent, or Firm*—Sughrue, Mion, Zinn Macpeak & Seas, PLLC

[57] ABSTRACT

Provided is a positive working photosensitive composition comprising (a) a compound represented by the following formula (I) which generates a sulfonic acid by irradiation with active rays or radiation, and (b) a resin comprising constitutional repeating units of the following formulae (II) and (III) and having groups which enable an increase of the solubility in an alkali developer through their decomposition due to the action of an acid:

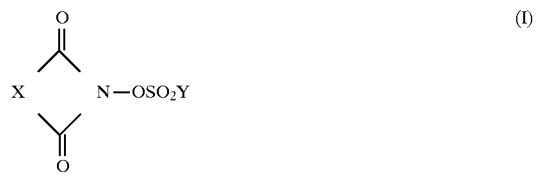

(I)

wherein Y represents an alkyl group, an aralkyl group, or a specific phenyl, naphthyl or anthracenyl group and Y may be bonded to the other imidesulfonate compound residue; and X represents an alkylene group, an alkenylene group, an arylene group, or an aralkylene group, and X may be bonded to the other imidesulfonate compound residue:

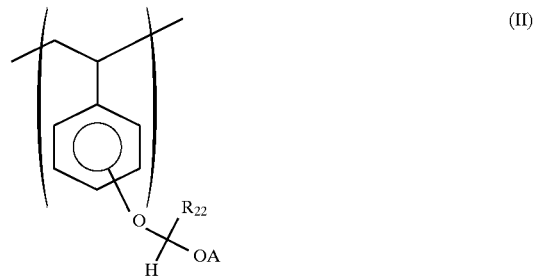

(II)

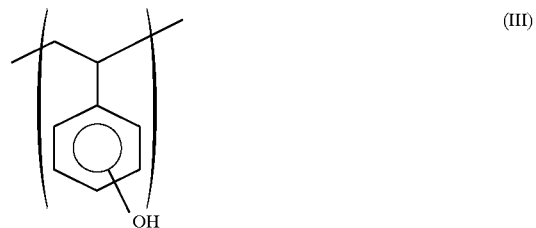

(III)

wherein $R_{22}$ represents a hydrogen atom, an alkyl group, or an aralkyl group; and A represents an alkyl group or an aralkyl group, and A may combine with $R_{22}$ to complete a 5- or 6-membered ring.

10 Claims, No Drawings

POSITIVE WORKING PHOTOSENSITIVE COMPOSITION

FIELD OF THE INVENTION

The present invention relates to a positive working photosensitive composition used in the manufacturing process of a lithographic printing plate or a semiconductor device such as IC, in the production of a circuit substrate for liquid crystal, a thermal head or the like, and in other photofabrication processes.

BACKGROUND OF THE INVENTION

In general, a composition of the type which comprises an alkali-soluble resin and a naphthoquinonediazide compound as photosensitive material has been used as positive photoresist composition. For instance, the combinations of novolak-type phenol resins with naphthoquinonediazido-substituted compounds are disclosed as compositions of the aforesaid type, e.g., in U.S. Pat. Nos. 3,666,473, 4,115,128 and 4,173,470, and the combinations of novolak resins prepared from cresols and formaldehyde with trihydroxybenzophenone-1,2-naphthoquinonediazide sulfonic acid esters are described as the most typical compositions in L. F. Thompson, *Introduction to Microlithography*, No. 2, 19, pp. 112–121, ACS publisher.

The positive photoresist as described above is constituted basically of a novolak resin and a quinonediazide compound. Therein, the novolak resin acts so as to provide high resistance to plasma etching and the naphthoquinonediazide compound functions as a dissolution inhibitor. Further, the naphthoquinonediazide has a characteristic of generating a carboxylic acid upon irradiation with light to lose the ability to inhibit dissolution, thereby heightening the solubility of a novolak resin in alkali.

From the aforementioned points of view, a large number of positive photoresist compositions which each comprise a novolak resin and a naphthoquinonediazide type photosensitive substance have hitherto been developed and put to practical use. In the microlithography for the lines having a width of the order of 0.8–2 $\mu$m, those compositions have accomplished satisfactory results.

On the other hand, the integration degree of an integrated circuit has become higher and higher in recent years, so that the microlithography for superfine patterns having a line width of half micron or below has come to be required in the production of semiconductor substrates for VLSI and the like. In order to achieve the resolution required therein, the wavelengths used in an exposure apparatus for photolithography were getting shorter, and nowadays the utilization of far ultraviolet light and excimer laser beams (XeCl, KrF, ArF) is being examined.

In a case where a conventional resist comprising a novolak resin and a naphthoquinonediazide compound is used for forming patterns by the lithography using far ultraviolet light or an excimer laser beam, it is difficult for the light to reach the lower part of the resist because a novolak resin and naphthoquinonediazide have strong absorption in the far ultraviolet region, so that such a resist has low sensitivity and can merely provide a pattern profile having a tapered shape.

As one means for solving the aforementioned problems, the chemically amplified resist compositions disclosed, e.g., in U.S. Pat. No. 4,491,628 and European Patent 0,249,139 can be used. The chemically amplified positive resist compositions refer to the pattern forming materials of the type which generate acids in the irradiated area upon exposure to radiation, such as far ultraviolet light, to cause a reaction utilizing these acids as catalyst, thereby making a difference of solubility in a developer between the areas irradiated and unirradiated with active radiation. By virtue of this solubility difference, a pattern can be formed on a substrate coated with a material of the foregoing type.

As examples of a chemically amplified resist composition, mention may be made of the combination of a compound capable of generating an acid by photolysis (which is called a photoacid generator, hereinafter) with acetal or an O, N-acetal compound (JP-A-48-89003, wherein the term "JP-A" means an unexamined published Japanese patent application"), the combination of a photoacid generator with an orthoester or amidoacetal compound (JP-A-51-120714), the combination of a photoacid generator with a polymer containing acetal or ketal groups in its main chain (JP-A-53-133429), the combination of a photoacid generator with an enol ether compound (JP-A-55-12995), the combination of a photoacid generator with an N-acyliminocarbonic acid compound (JP-A-55-126236), the combination of a photoacid generator with a polymer containing orthoester groups in its main chain (JP-A-56-17345), the combination of a photoacid generator with a tertiary alkyl ester compound (JP-A-60-3625), the combination of a photoacid generator with a silyl ester compound (JP-A-60-10247) and the combinations with a photoacid generator with silyl ether compounds (JP-A-60-37549 and JP-A-60-121446). Those combinations have a quantum yield greater than 1 in principle, so that they exhibit high sensitivity.

As examples of a similar system to the above, which is stable upon storage at room temperature but decomposes by heating in the presence of an acid to acquire solubility in an alkali, mention may be made of the systems described, e.g., in JP-A-59-45439, JP-A-60-3625, JP-A-62-229242, JP-A-63-27829, JP-A-63-36240, JP-A-63-250642, *Polym. Eng. Sce.*, vol. 23, p. 1012 (1983); *ACS. Sym.*, vol. 242, p. 11 (1984); *Semiconductor World*, the November number, p. 91 (1987); *Macromolecules*, vol. 21, p. 1475 (1988); and *SPIE*, vol. 920, p. 42 (1988); wherein compounds capable of generating acids by exposure to light are combined with tertiary or secondary alkyl (e.g., t-butyl, 2-cyclohexenyl) esters or carbonate compounds. Such systems also have high sensitivity, and their absorption in Deep-UV region is weak, compared with a naphthoquinonediazide/novolak resin system. Thus, the use of those systems can also be effective in shortening the wavelengths of a light source.

The foregoing chemically amplified positive resist compositions can be grouped into two main classes, namely a class of three-component systems comprising an alkali-soluble resin, a compound capable of generating an acid by exposure to radiation (a photoacid generator) and a compound which contains acid-decomposable group(s) and can inhibit the dissolution of an alkali-soluble resin (a dissolution inhibitor) and a class of two-component systems comprising a resin containing groups which are decomposed by the reaction with an acid to become soluble in an alkali and a photoacid generator.

Such a two- or three-component positive resist of chemical amplification type forms a resist pattern by undergoing development after a heat treatment in the presence of an acid which is generated from a photoacid generator by exposure to light.

With respect to photoacid generators used in the aforementioned positive resist of chemical amplification type, although an N-oxime sulfonate, an o-nitrobenzyl sulfonate, a pyrogallol trismethanesulfonate and so on were known, the sulfonium or iodonium salts of perfluoro Lewis acids, such as $PF_6^-$, $AsF_6^-$ and $SbF_6^-$, as described in JP-A-59-45439 and *Polym. Eng. Sci.*, 23, 1012 (1983) have been used as typical photoacid generators since they have high photolysis efficiency and excellent image forming capability.

In cases where such photoacid generators are used in resist materials for semiconductors, however, contamination with phosphorus, arsenic and antimony arising from the counter anions of those photoacid generators becomes a problem.

As sulfonium and iodonium compounds free from such contamination, the salts whose counter anion is trifluoromethanesulfonic acid anion, such as those described in JP-A-63-27829, JP-A-2-25850, JP-A-2-150848, JP-A-5-134414 and JP-A-5-232705, are used.

However, the use of those salts gives rise to a problem such that the resist pattern is thinned and the profile thereof comes to have a T-shape top with the passage of time in the period from exposure to heat treatment.

As a means for solving the above problem, the photosensitive composition using an acetal group-protected hydroxystyrene resin and a particular acid generator is described in JP-A-5-242682. This means is effective in controlling the formation of T-shape top but insufficient for preventing the resist pattern from being thinned with the lapse of time in the period from exposure to heat treatment.

Further, the resist composition using an acid-labile compound containing a ketal component and a photoacid generator is described in JP-A-7-140666. This composition also has an effect on prevention of the T-shape top formation, but it does not produce sufficient effect in controlling the thinning of resist pattern. In addition, that composition has a serious drawback in storage stability.

SUMMARY OF THE INVENTION

Therefore, one object of the present invention is to solve the aforementioned problems of conventional arts and, more specifically, to provide a positive working photosensitive composition which has high photolysis efficiency, and consequently, has high sensitivity to ensure the formation of an excellent resist pattern.

Another object of the present invention is to provide a positive working photosensitive composition which causes neither thinning in a resist pattern nor T-shape formation at the top of the pattern profile with the passage of time in the period from exposure to heat treatment, and has excellent storage stability.

As a result of our intensive studies carried out taking the above-described characteristics into account, it has been found that the objects of the present invention can be attained by using a particular sulfonic acid-generating compound described below and a resin having a particular structure illustrated below in a positive chemical amplification system.

More specifically, the present invention has the following constitution [1] or [2]:

[1] A positive working photosensitive composition comprising
  (a) a compound represented by the following formula (I) which generates a sulfonic acid by irradiation with active rays or radiation, and
  (b) a resin comprising constitutional repeating units of the following formulae (II) and (III) and having groups which enable an increase of the solubility in an alkali developer through their decomposition due to the action of an acid:

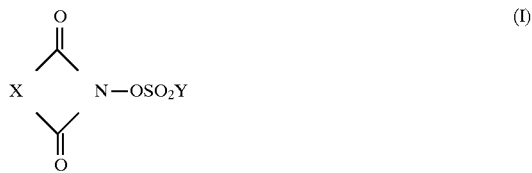

wherein Y represents an optionally substituted straight-chain, branched, or cyclic alkyl group, an optionally substituted aralkyl group, or a group illustrated below;

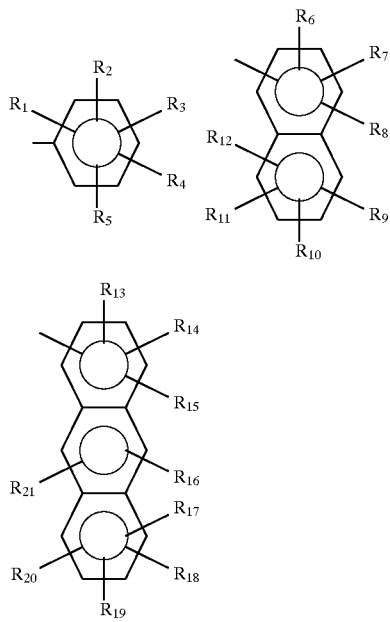

wherein the substituent groups from $R_1$ to $R_{21}$ are the same or different, and each is a hydrogen atom, an optionally substituted straight-chain, branched, or cyclic alkyl group, an optionally substituted alkoxy group, an acyl group, a formyl group, a nitro group, an acylamino group, a sulfonylamino group, an optionally substituted aryl group, an optionally substituted alkoxycarbonyl group, a chlorine atom, a bromine atom, an iodine atom, a hydroxyl group, a cyano group, an acyloxy group, or an optionally substituted aralkyl group; optional two of the substituent groups from $R_1$ to $R_5$, from $R_6$ to $R_{12}$, and from $R_{13}$ to $R_{21}$, respectively, may combine to complete a 5- to 8-membered ring composed of a carbon atom and/or a hetero atom; Y may be bonded to the other imidesulfonate compound residue; and X represents an optionally substituted straight-chain or branched alkylene group, an optionally substituted monocyclic or polycyclic alkylene group which may contain a hetero atom, an optionally substituted straight-chain or branched alkenylene group, an optionally substituted monocyclic or polycyclic alkenylene group which may contain a hetero atom, an optionally substituted arylene group, or an optionally substituted aralkylene group, and X may be bonded to the other imidesulfonate compound residue:

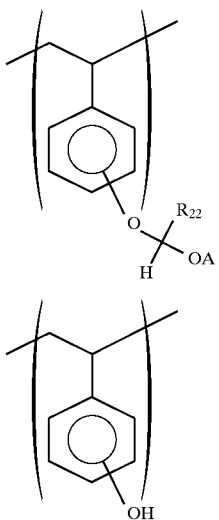

wherein $R_{22}$ represents a hydrogen atom, an optionally substituted straight-chain, branched or cyclic alkyl group, or an optionally substituted aralkyl group; and A represents an optionally substituted straight-chain, branched or cyclic alkyl group, or an optionally substituted aralkyl group, and A may combine with $R_{22}$ to complete a 5- or 6-membered ring.

[2] A positive working photosensitive composition according to the constitution [1], further comprising (c) a low molecular, acid-decomposable, dissolution-inhibiting compound which has a molecular weight of no greater than 3,000, contains groups capable of being decomposed by an acid and increases the solubility in an alkali developer due to the action of the acid.

As mentioned above, the combined use of the compound of the foregoing formula (I) as a photoacid generator and the resin having particular repeating units successfully solves the problem caused in a chemically amplified resist due to the passage of time in the period from exposure to heat treatment, and heightens the photolysis efficiency, thereby ensuring high sensitivity to light and formation of excellent resist patterns.

DETAILED DESCRIPTION OF THE INVENTION

The compounds used in the present invention are illustrated below in detail.

(a) Acid Generating Compound of Formula (I)

As for the straight-chain, branched or cyclic alkyl group represented by Y and $R_1$ to $R_{21}$ in the foregoing formula (I), straight-chain or branched alkyl groups containing 1 to 20 carbon atoms, such as methyl, ethyl, propyl, isopropyl, n-butyl, sec-butyl, t-butyl, hexyl and octyl, are examples thereof. As for the cyclic alkyl group, cyclopropyl, cyclopentyl and cyclohexyl groups are examples thereof. As suitable examples of a substituent which the alkyl group can have, mention may be made of an alkoxy group, an acyl group, an acyloxy group, a chlorine atom, a bromine atom and an iodine atom.

As for the aralkyl group represented by Y, those containing 7 to 12 carbon atoms, such as benzyl and phenetyl groups, are examples thereof. As suitable examples of a substituent which the aralkyl group can have, mention may be made of a lower alkyl group containing 1 to 4 carbon atoms, a lower alkoxy group containing 1 to 4 carbon atoms, a nitro group, an acetylamino group and a halogen atom.

As for the alkoxy group represented by $R_1$ to $R_{21}$, alkoxy groups containing 1 to 20 carbon atoms, such as methoxy, ethoxy, propoxy, isopropoxy, n-butoxy, isobutoxy, sec-butoxy, t-butoxy, octyloxy and dodecyloxy groups, and ethoxyethoxy group are examples thereof. As for the acyl group, acetyl, propionyl and benzoyl groups are examples thereof. As for the acylamino group, acetylamino, propionylamino and benzoylamino groups are examples thereof. As for the sulfonylamino group, those containing 1 to 4 carbon atoms, such as methanesulfonylamino and ethanesulfonylamino groups, and substituted or unsubstituted benzenesulfonylamino groups, such as a p-toluenesulfonylamino group, are examples thereof. As for the aryl group, phenyl, tolyl and naphthyl groups are examples thereof. As for the alkoxycarbonyl group, those containing 2 to 20 carbon atoms, such as methoxycarbonyl, ethoxycarbonyl, octyloxycarbonyl and dedecyloxycarbonyl groups, and ethoxyethoxycarbonyl group are examples thereof.

As for the acyloxy group, those containing 2 to 20 carbon atoms, such as acetoxy, propanoyloxy, octanoyloxy and benzoyloxy groups, are examples thereof.

As for the aralkyl group, those containing 7 to 15 carbon atoms, such as substituted or unsubstituted benzyl and substituted or unsubstituted phenethyl groups, are examples thereof. As suitable examples of a substituent which the aralkyl group can have, mention may be made of those as defined hereinbefore.

Further, optional two of the substituent groups from $R_1$ to $R_5$, from $R_6$ to $R_{12}$, and from $R_{13}$ to $R_{21}$, respectively, may combine to complete a 5- to 8-membered ring composed of a carbon atom and/or a hetero atom, such as cyclohexane, pyridine, furan and pyrrolidine.

Furthermore, X and Y each may be bonded to the other imidesulfonate compound residue such as a compound represented by formula (I) to form a dimer, a trimer, etc.

With respect to the alkylene group represented by X, straight-chain and branched alkylene groups containing 1 to 10 carbon atoms and cyclic alkylene groups which may have hetero atoms are examples thereof. As for the alkylene group, methylene, ethylene, propylene and octylene groups are examples thereof. As suitable examples of a substituent the alkylene group can have, mention may be made of an alkoxy group, an acyl group, a formyl group, a nitro group, an acylamino group, a sulfonylamino group, a halogen atom, an aryl group and an alkoxycarbonyl group. These alkoxy, acyl, nitro, acylamino, sulfonylamino, aryl and alkoxycarbonyl groups have the same meanings as those recited for the definition of $R_1$ to $R_{21}$, respectively. As for the halogen atom, fluorine, chlorine, bromine and iodine atoms are examples thereof.

With respect to the cyclic alkylene group represented by X, monocyclic alkylene groups containing 4 to 8 carbon atoms, such as cyclopentyl and cyclohexyl groups, and polycyclic alkylene groups containing 5 to 15 carbon atoms, such as 7-oxabicyclo [2,2,1] heptylene group are examples thereof. As suitable examples of a substituent the cyclic alkylene group can have, mention may be made of an alkyl group containing 1 to 4 carbon atoms, an alkoxy group, an acyl group, a formyl group, a nitro group, an acylamino group, a sulfonylamino group, a halogen atom, an aryl group and an alkoxycarbonyl group. These alkoxy, acyl, nitro, acylamino, sulfonylamino, aryl and alkoxycarbonyl groups have the same meanings as those recited for the definition of $R_1$ to $R_{21}$, respectively. As for the halogen atom, fluorine, chlorine, bromine and iodine atoms are examples thereof.

With respect to the arylene group represented by X, a phenylene group and a naphthylene group are examples thereof. As suitable examples of a substituent the arylene group can have, mention may be made of an alkyl group, a cycloalkyl group, an alkoxy group, an acyl group, a formyl group, a nitro group, an acylamino group, a sulfonylamino group, a halogen atom, an aryl group and an alkoxycarbonyl group. These alkyl, cycloalkyl, alkoxy, acyl, formyl, nitro, acylamino, sulfonylamino, aryl and alkoxycarbonyl groups have the same meanings as those recited for the definition of $R_1$ to $R_{21}$, respectively. As for the halogen atom, fluorine, chlorine, bromine and iodine atoms are examples thereof.

With respect to the alkenylene group represented by X, those containing 2 to 4 carbon atoms, such as an ethenylene group and a butenylene group, are examples thereof. As suitable examples of a substituent the alkenylene group can have, mention may be made of an alkyl group, a cycloalkyl group, an alkoxy group, an acyl group, a formyl group, a nitro group, an acylamino group, a sulfonylamino group, a halogen atom, an aryl group and an alkoxycarbonyl group. These alkyl, cycloalkyl, alkoxy, acyl, formyl, nitro, acylamino, sulfonylamino, aryl and alkoxycarbonyl groups have the same meanings as those recited for the definition of $R_1$ to $R_{21}$, respectively. As for the halogen atom, fluorine, chlorine, bromine and iodine atoms are examples thereof.

With respect to the cyclic alkenylene group represented by X, monocyclic alkenylene groups containing 4 to 8 carbon atoms, such as cyclopentenylene and cyclohexenylene groups, and polycyclic alkenylene groups containing 5 to 15 carbon atoms, such as 7-oxabicyclo [2,2,1] heptenylene and norbornenylene group are examples thereof.

With respect to the aralkylene group represented by X, tolylene and xylylene groups are examples thereof. As suitable examples of a substituent the aralkylene group can have, mention may be made of an alkyl group, a cycloalkyl group, an alkoxy group, an acyl group, a formyl group, a nitro group, an acylamino group, a sulfonylamino group, a halogen atom, an aryl group and an alkoxycarbonyl group.

The appropriate proportion of the present compound represented by formula (I) in the total composition is from 0.1 to 20 weight %, preferably from 0.5 to 10 weight %, and more preferably from 1 to 7 weight %, on a solids basis.

Specific examples of a compound represented by formula (I) include the following Compounds (I-1) to (I-38), but these examples are not to be construed as limiting the scope of the invention in any way.

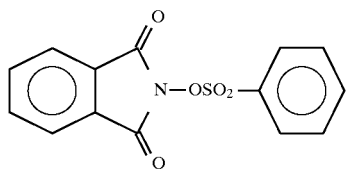
(I-1)

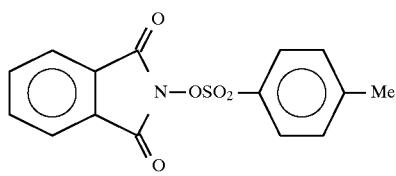
(I-2)

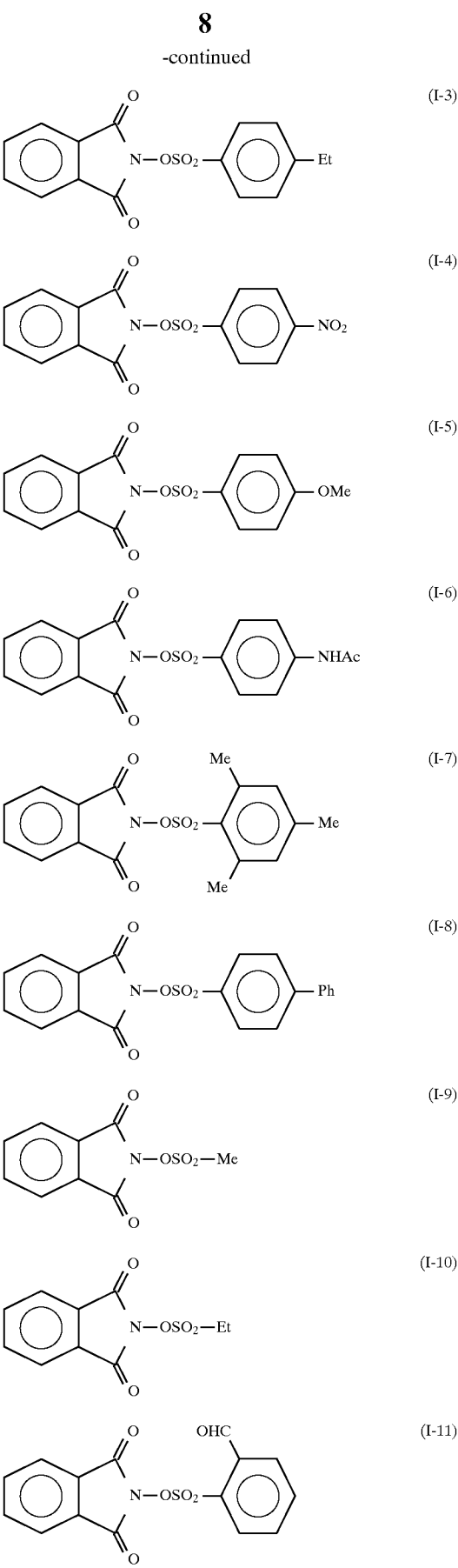

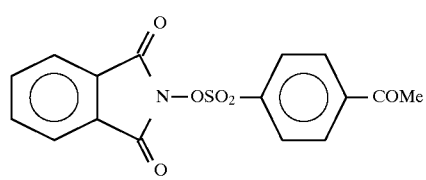 (I-12)
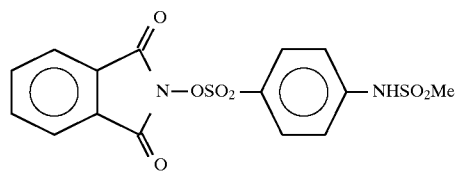 (I-13)
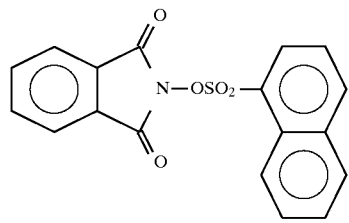 (I-14)
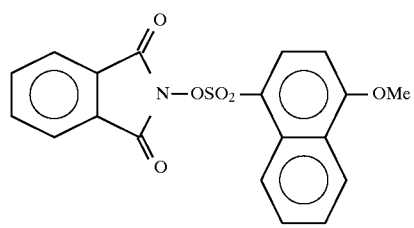 (I-15)
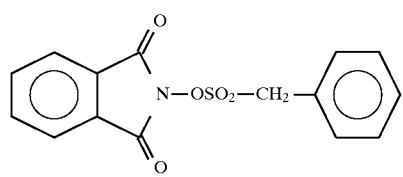 (I-16)
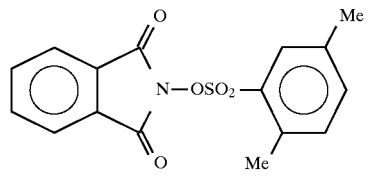 (I-17)
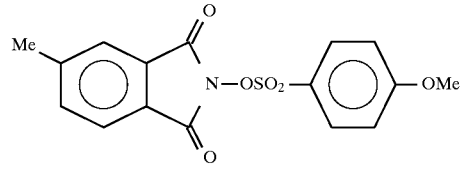 (I-18)
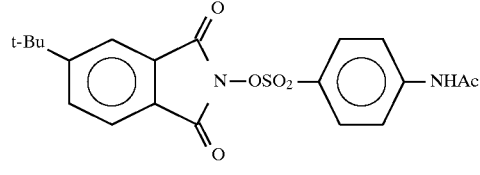 (I-19)
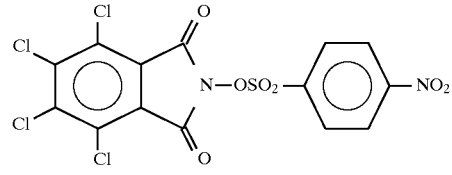 (I-20)
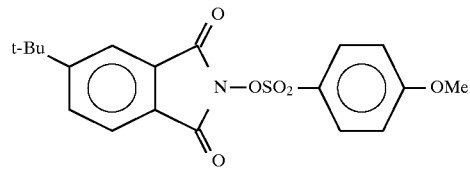 (I-21)
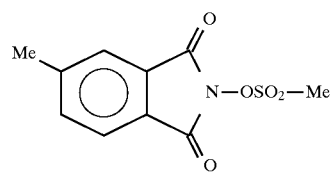 (I-22)
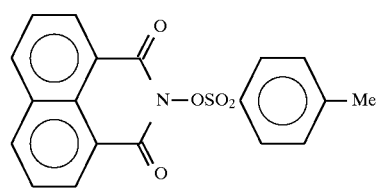 (I-23)
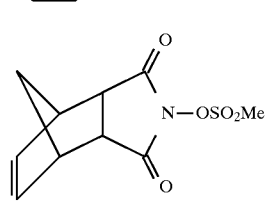 (I-24)
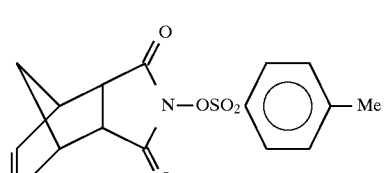 (I-25)
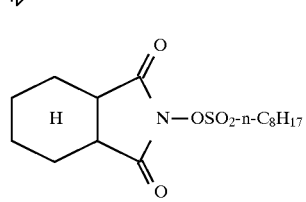 (I-26)
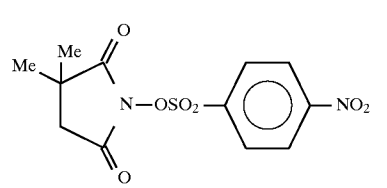 (I-27)
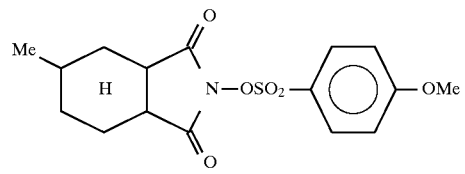 (I-28)

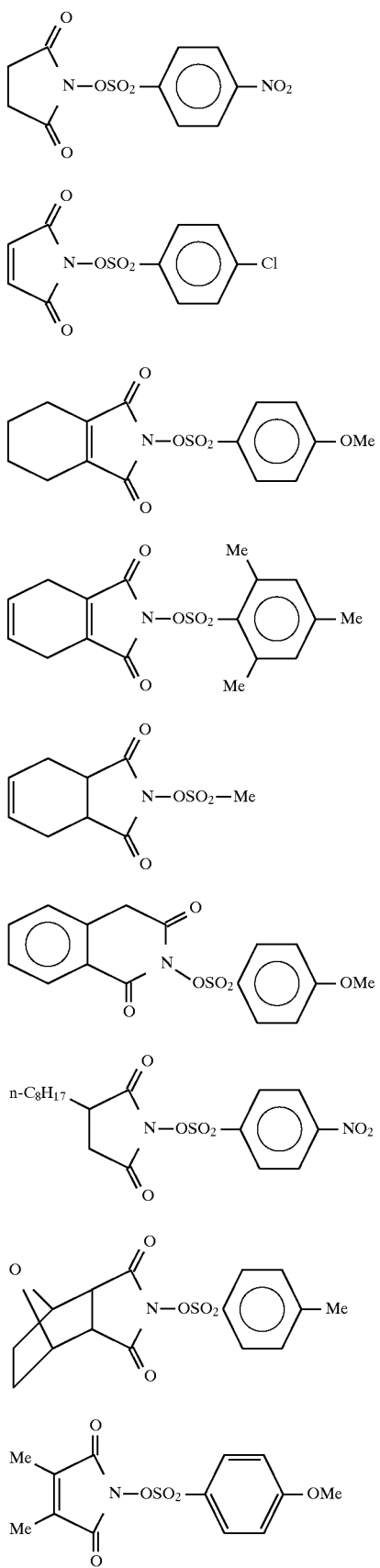
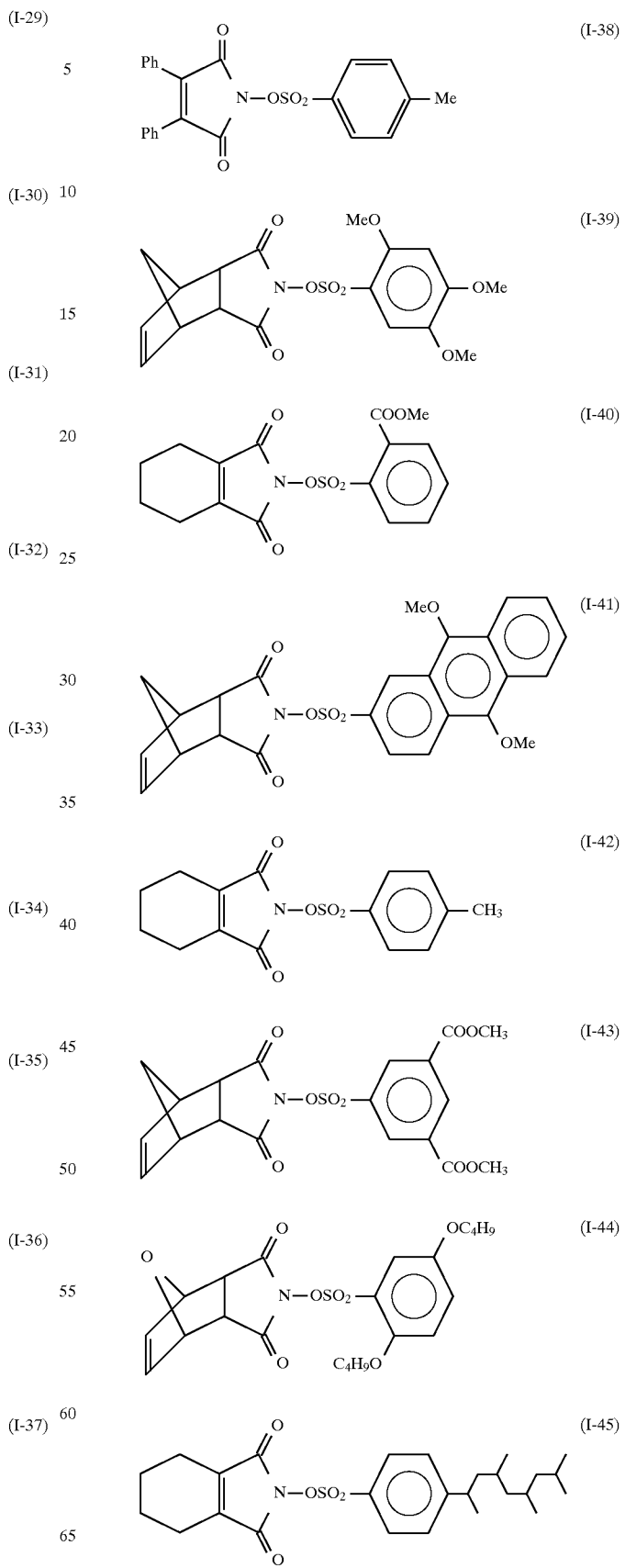

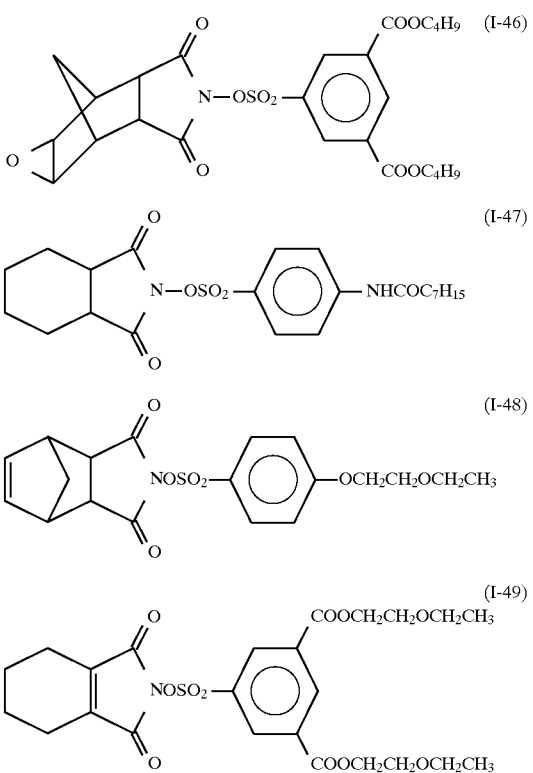

The compound represented by formula (I) can be synthesized by reacting an N-hydroxyimide compound, which is prepared using the method described, e.g., in G. F. Jaubert, Ber., 28, 360 (1895), D. E. Ames et al., J. Chem. Soc., 3518 (1955), or M. A. Stolberg et al., J. Am. Chem. Soc., 79, 2615 (1957), with sulfonic acid chloride under a basic condition according to the method described, e.g., in L. Bauer et al., J. Org. Chem., 24, 1294 (1959).

Other Acid-Generating Compounds Usable Together with Present Compound

In addition to the aforementioned sulfonic acid-generating compound of formula (I), other compounds which are decomposed by irradiation with active rays or radiation to generate acids may also be used in the present invention.

The ratio of the present compound of formula (I) to a photoacid generator usable together therewith is from 95/5 to 20/80, preferably from 90/10 to 40/60, and more preferably from 80/20 to 60/40, by mole.

The photoacid generator suitably used together with the present compound of formula (I) can be selected from among a photoinitiator for photo cationic polymerization, a photoinitiator for photo radical polymerization, a photodecolorizer for dyes, a photo discoloring agent, known photoacid generators used for microresist and the like, and a mixture of two or more of the above agents.

As examples of compounds employable as those agents, mention may be made of the diazonium salts described, e.g., in S. I. Schlesinger, Photogr. Sci. Eng., 18, 387 (1974), and T. S. Bal et al., Polymer, 21, 423 (1980); onium salts, such as the ammonium salts described, e.g., in U.S. Pat. Nos. 4,069,055, 4,069,056 and Re 27,992, the phosphonium salts described, e.g., in D. C. Necker et al., Macromolecules, 17, 2468 (1984), C. S. Wen et al., Teh. Proc. Conf. Rad. Curing ASIA, p. 478, Tokyo (October, 1988), and U.S. Pat. Nos. 4,069,055 and 4,069,056, the iodonium salts described, e.g., in J. V. Crivello et al., Macromolecules, 10 (6), 1307 (1977), Chem. & Eng. News, Nov. 28, p. 31 (1988), European Patent 0,104,143, U.S. Pat. Nos. 339,049 and 410,210, JP-A-2-150848 and JP-A-2-296514, the sulfonium salts described, e.g., in J. V. Crivello et al., Polymer J., 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14 (5), 1141 (1981), J. V. Crivello et al., J. Polymer Sci., Polymer Chem. Ed., 17, 2877 (1979), European Patents Nos. 0,370,693, 3,902,114, 0,233, 567, 0,297,443 and 0,297,422, U.S. Pat. Nos. 4,933,377, 161,811, 410,201, 339,049, 4,760,013, 4,734,444 and 2,833, 827, and German Patents 2,904,626, 3,604,580 and 3,604, 581, the selenonium salts described, e.g., in J. V. Crivello et al., Macromolecules, 10 (6), 1307 (1977), and J. V. Crivello et al., J. Polymer Sci., Polymer Chem. Ed., 17, 1047 (1979), and the arsonium salts described, e.g., in C. S. Wen et al., Teh. Proc. Conf. Rad. Curing ASIA, p. 478, Tokyo (October, 1988); the organic halogen-compounds described, e.g., in U.S. Pat. No. 3,905,815, JP-B-46-4605 (The term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339; the organometallic compounds/organic halides described, e.g., in K. Meier et al., J. Rad. Curing, 13 (4), 26 (1986), T. P. Gill et al., Inorg. Chem., 19, 3007 (1980), D. Astruc, Acc. Chem. Res., 19 (12), 377 (1896), and JP-A-2-161445; the photoacid generators having o-nitrobenzyl type protective groups described, e.g., in S. Hayase et al., J. Polymer Sci., 25, 753 (1987), E. Reichmanis et al., J. Polymer Sci., Polymer Chem. Ed., 23, 1 (1985), Q. Q. Zhu et al., J. Photochem., 36, 85, 39, 317 (1987), B. Amit et al., Tetrahedron Lett., (24) 2205 (1973), D. H. R. Barton et al., J. Chem. Soc., 3571 (1965), P. M. Collins et al., J. Chem. Soc., Perkin I, 1695 (1975), M. Rudinstein et al., Tetrahedron Lett., (17), 1445 (1975), J. W. Walker et al., J. Am. Chem. Soc., 110, 7170 (1988), S. C. Busman et al., J. Imaging Technol., 11 (4), 191 (1985), H. M. Houlihan et al., Macromolecules, 21, 2001 (1988), P. M. Collins et al., J. Chem. Soc., Chem. Commun., 532 (1972), S. Hayase et al., Macromolecules, 18, 1799 (1985), E. Reichmanis et al., J. Electrochem. Soc., Solid State Sci. Technol., 130 (6), F. M. Houlihan et al., Macromolecules, 21, 2001 (1988), European Patent Nos. 0,290,750, 0,046,083, 0,156,535, 0,271,851 and 0,388,343, U.S. Pat. Nos. 3,901,710 and 4,181,531, JP-A-60-198538 and JP-A-53-133022; and the disulfone compounds described, e.g., in JP-A-61-166544.

In addition, the polymers having main or side chains into which groups or compounds capable of generating acids under light are introduced, such as the compounds described, e.g., in M. E. Woodhouse et al., J. Am. Chem. Soc., 104, 5586 (1982), S. P. Pappas et al., J. Imaging Sci., 30 (5), 218 (1986), S. Kondo et al., Makromol. Chem., Rapid Commun., 9, 625 (1988), Y. Yamada et al., Makromol. Chem., 152, 153, 163 (1972), J. V. Crivello et al., J. Polymer Sci., Polymer Chem. Ed., 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, can be employed.

Further, the compounds capable of generating acids under light described, e.g., in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778 and European Patent No. 0,126,712, can be employed, too.

Of the compounds recited above as those which can be decomposed by irradiation with active rays or radiation to generate acids, the following compounds are especially advantageous to the combined use with the present compound of formula (I):

(1) A trihalomethyl-substituted oxazole compound of the following formula (PAG1), or a trihalomethyl-substituted s-triazine compound of the following formula (PAG2);

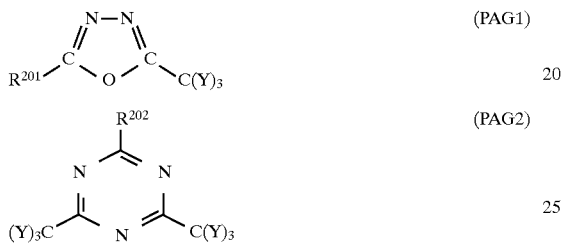

wherein $R^{201}$ is a substituted or unsubstituted aryl or alkenyl group, $R^{202}$ is a substituted or unsubstituted aryl, alkenyl or alkyl group or —C(Y)$_3$, and Y is a chlorine or bromine atom.

Specific examples of such compounds are illustrated below, but these examples should not be construed as limiting the scope of the present invention.

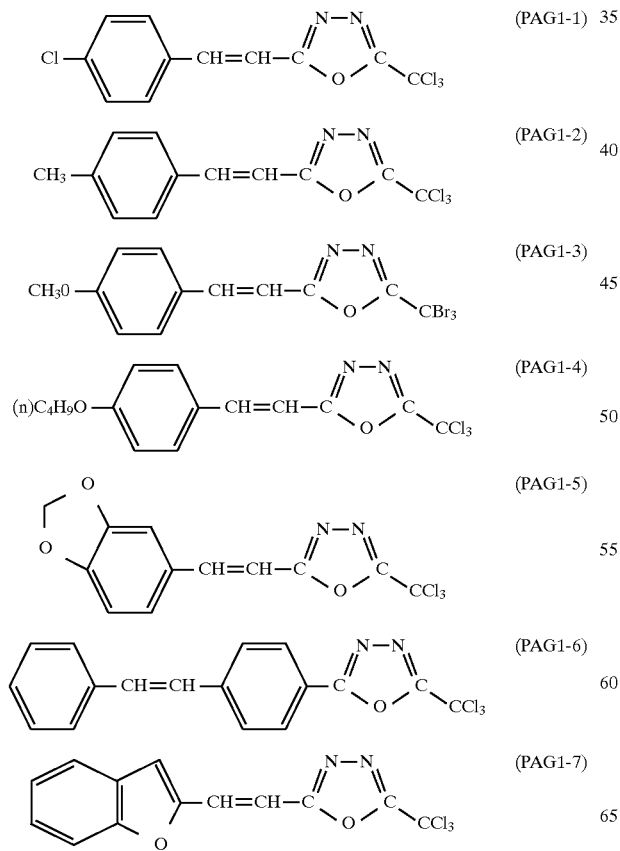

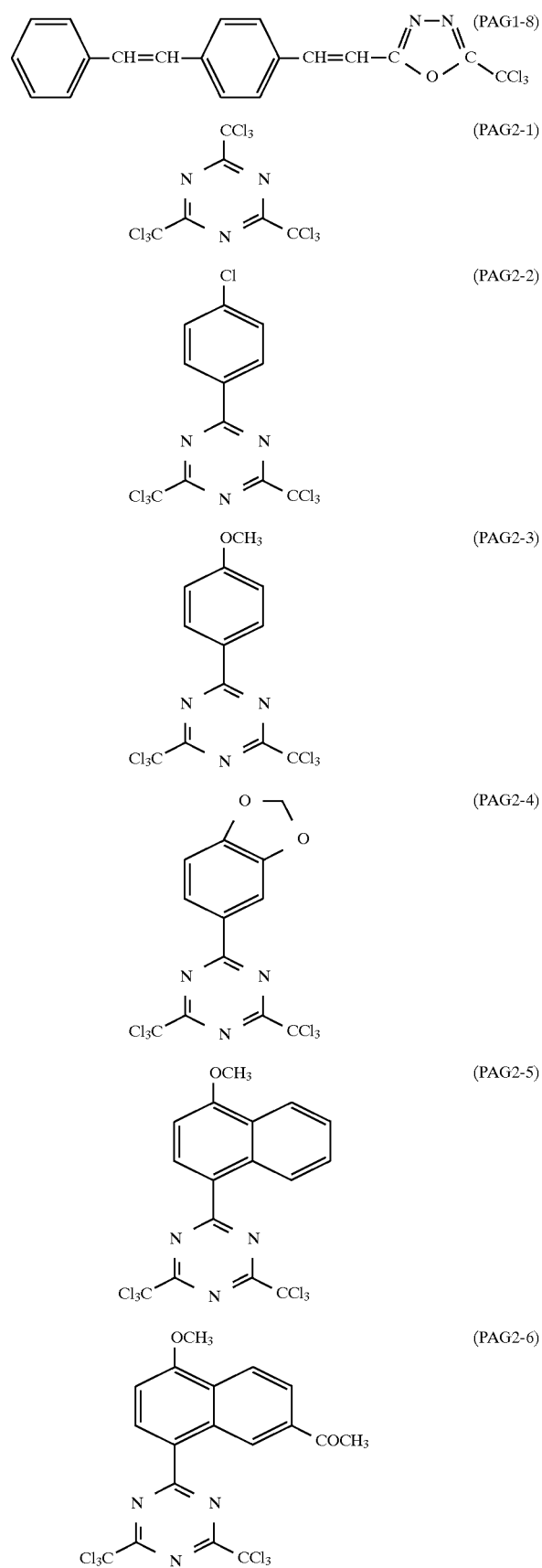

(PAG2-7)
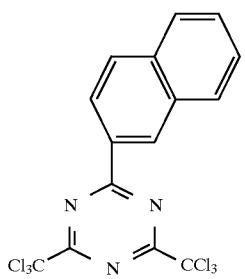

(PAG2-8)
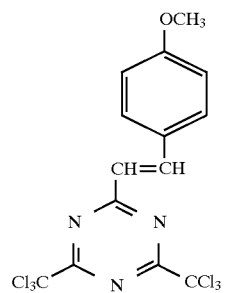

(PAG2-9)
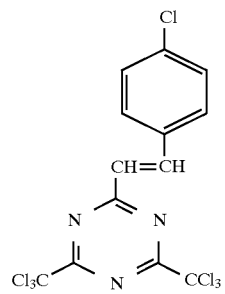

(PAG2-10)
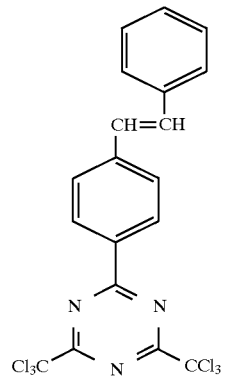

(2) An iodonium salt of the following formula (PAG3), or a sulfonium salt of the following formula (PAG4):

$$\begin{array}{c} Ar^1 \\ \diagdown \\ I^+Z^- \\ \diagup \\ Ar^2 \end{array}$$ (PAG3)

$$\begin{array}{c} R^{203} \\ \diagdown \\ R^{204}-S^+Z^- \\ \diagup \\ R^{205} \end{array}$$ (PAG4)

In the above formulae, $Ar^1$ and $Ar^2$ are each an aryl group having no or some substituent(s). Suitable examples of such substituent(s) include an alkyl group, a haloalkyl group, a cycloalkyl group, an aryl group, an alkoxy group, a nitro group, a carboxyl group, an alkoxycarbonyl group, a hydroxy group, a mercapto group and a halogen atom.

$R^{203}$, $R^{204}$ and $R^{205}$ are each a substituted or unsubstituted alkyl or aryl group. Preferably, each of them is a 6-14C aryl group which has no or some substituent(s) or a 1-8C alkyl group which has no or some substituent(s). Examples of substituent(s) suitable for the aryl group include a 1-8C alkoxy group, a 1-8C alkyl group, a nitro group, a carboxyl group, a hydroxy group and a halogen atom, and those for the alkyl group include a 1-8C alkoxy group, a carboxyl group and an alkoxycarbonyl group.

$Z^-$ is a counter anion, such as $BF_4^-$, $AsF_6^-$, $PF_6^-$, $SbF_6^-$, $SiF_6^{2-}$, $ClO_4^-$, a substituted or unsubstituted alkylsulfonic acid anion such as methanesulfonic acid anion or trifluoromethanesulfonic acid anion, a substituted or unsubstituted benzenesulfonic acid anion such as toluenesulfonic acid anion or pentafluorobenzenesulfonic acid anion, or a substituted or unsubstituted condensed polynuclear aromatic sulfonic acid anion such as naphthalenesulfonic acid anion or anthraquinonesulfonic acid anion, or a dye containing sulfonic acid group. However, the counter anion as Z should not be construed as being limited to the above-recited ones.

Further, two among $R^{203}$, $R^{204}$ and $R^{205}$, and two of $Ar^1$ and $Ar^2$ as well, may combine with each other via a single bond or a substituent.

Specific examples of such compounds are illustrated below, but these examples should not be construed as limiting the scope of the present invention.

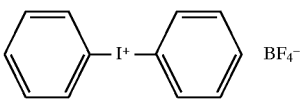 (PAG3-1)

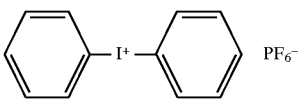 (PAG3-2)

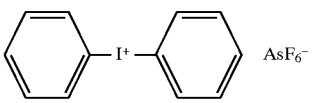 (PAG3-3)

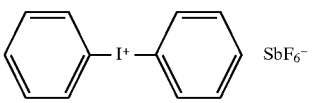 (PAG3-4)

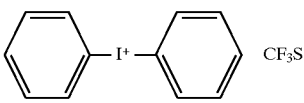 (PAG3-5)

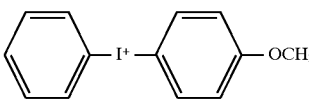 (PAG3-6)

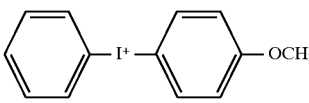 (PAG3-7)

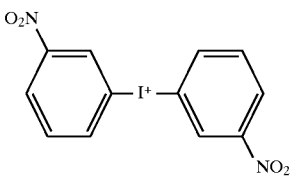 (PAG3-8)

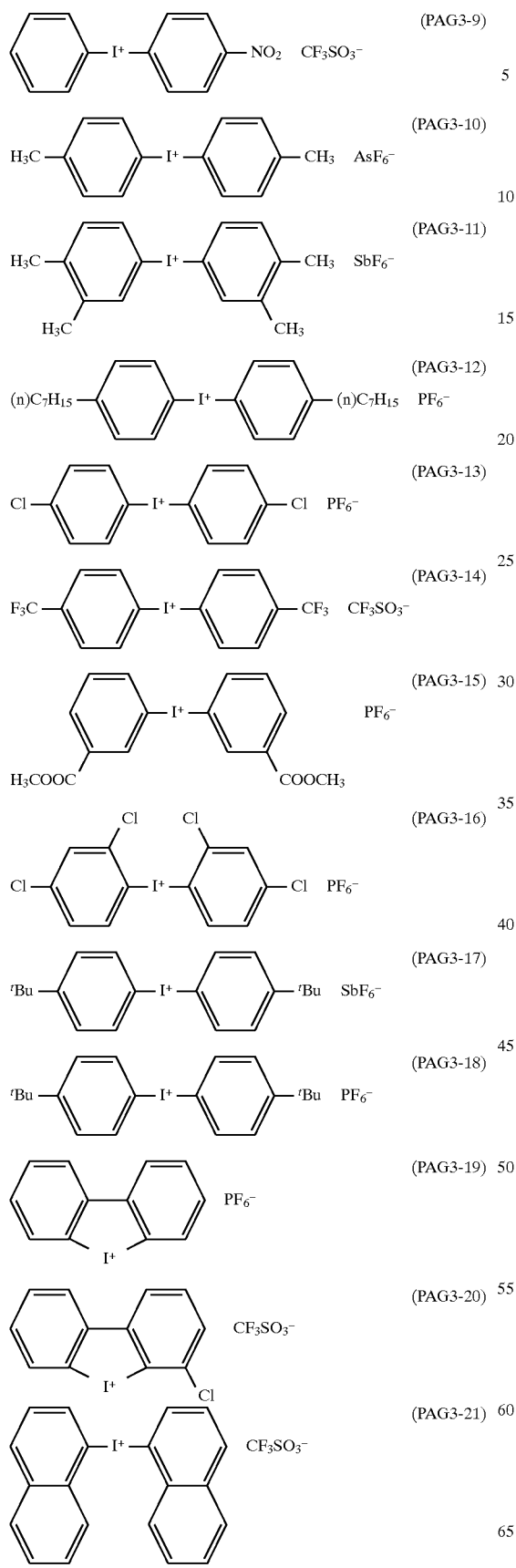
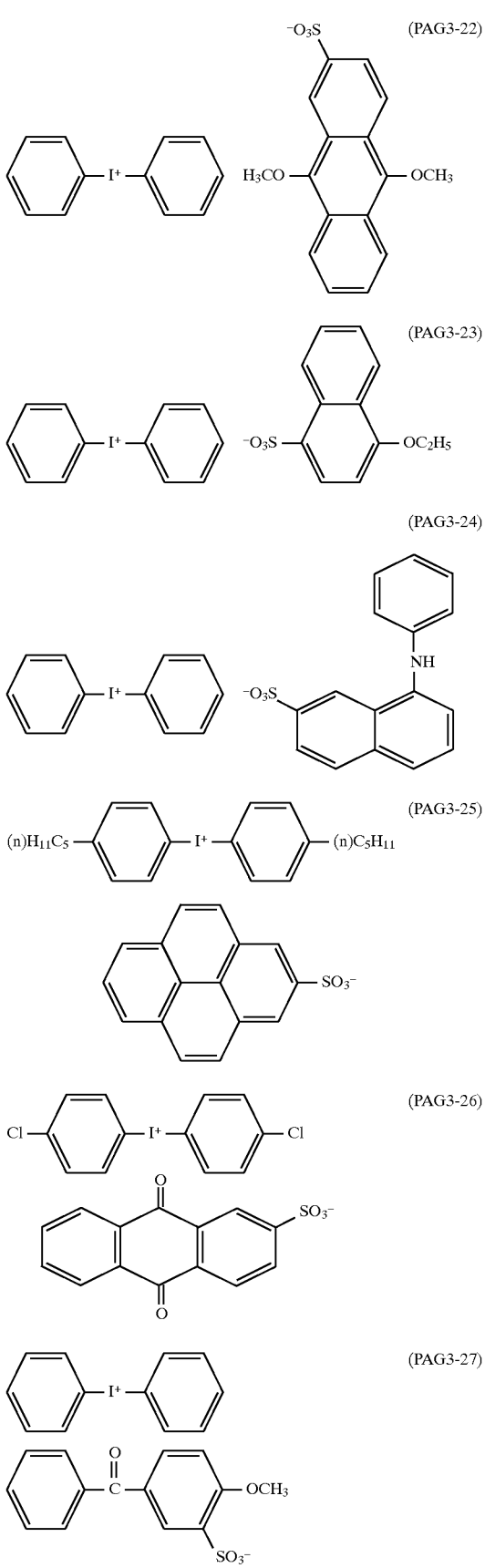

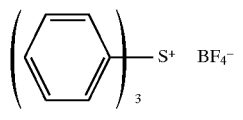 (PAG4-1)
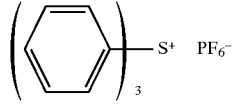 (PAG4-2)
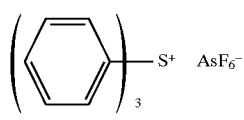 (PAG4-3)
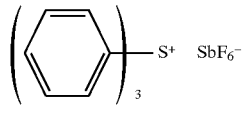 (PAG4-4)
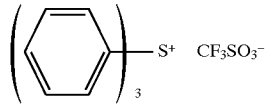 (PAG4-5)
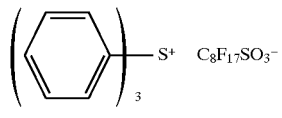 (PAG4-6)
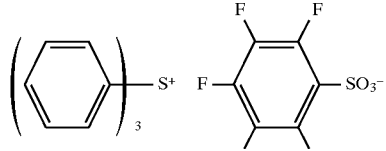 (PAG4-7)
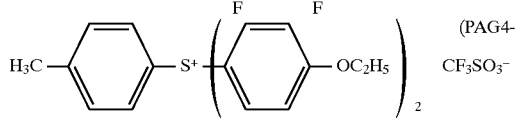 (PAG4-8)
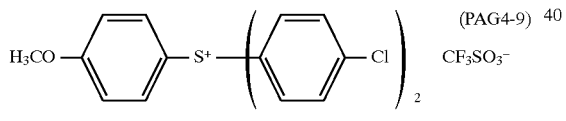 (PAG4-9)
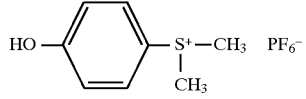 (PAG4-10)
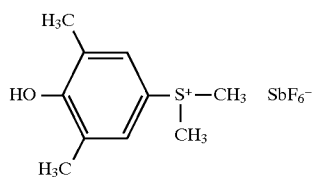 (PAG4-11)
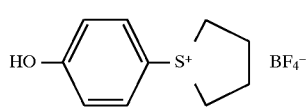 (PAG4-12)
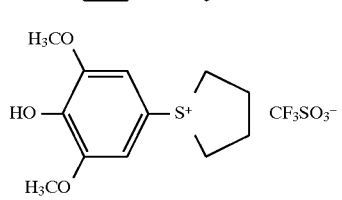 (PAG4-13)
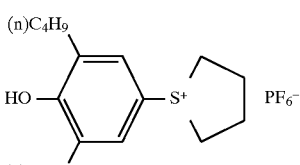 (PAG4-14)
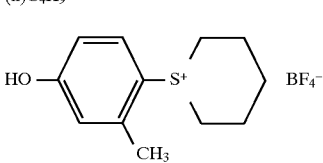 (PAG4-15)
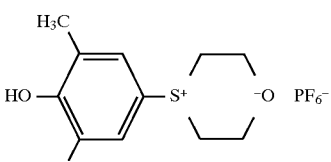 (PAG4-16)
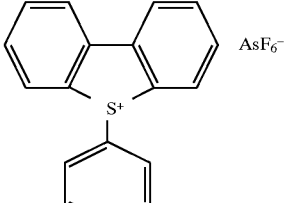 (PAG4-17)
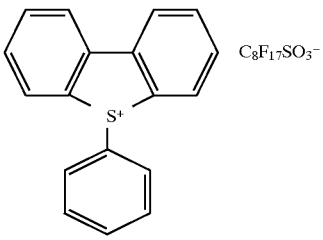 (PAG4-18)
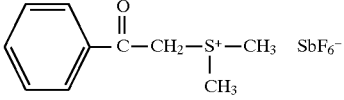 (PAG4-19)
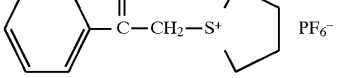 (PAG4-20)
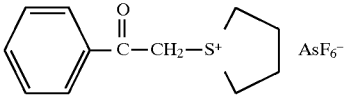 (PAG4-21)
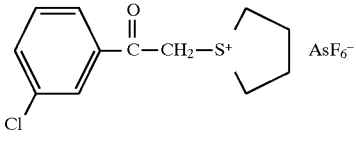 (PAG4-22)
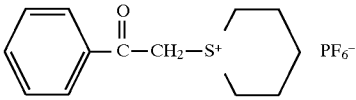 (PAG4-23)

The above-illustrated onium salts of formulae (PAG3) and (PAG4) are known compounds, and can be prepared using the methods described, e.g., in J. W. Knapczyk et al., *J. Am. Chem. Soc.,* 91, 145 (1969), A. L. Maycok et al., *J. Org. Chem.,* 35, 2532 (1970), E. Goethas et al., *Bull. Soc. Chem. Belg.,* 73, 546 (1964), H. M. Leicester, *J. Am. Chem. Soc.,* 51, 3587 (1929), J. V. Crivello et al., *J. Polymer Sci., Polymer Chem. Ed.,* 18, 2677 (1980), U.S. Pat. Nos. 2,807, 648 and 4,247,473, and JP-A-53-101331.

(3) A disulfone compound of the following formula (PAG5):

$$Ar^3-SO_2-SO_2-Ar^4 \qquad \text{(PAG5)}$$

wherein $Ar^3$ and $Ar^4$ are each a substituted or unsubstituted aryl group.

Specific examples of such a compound are illustrated below, but these examples should not be construed as limiting the scope of the present invention.

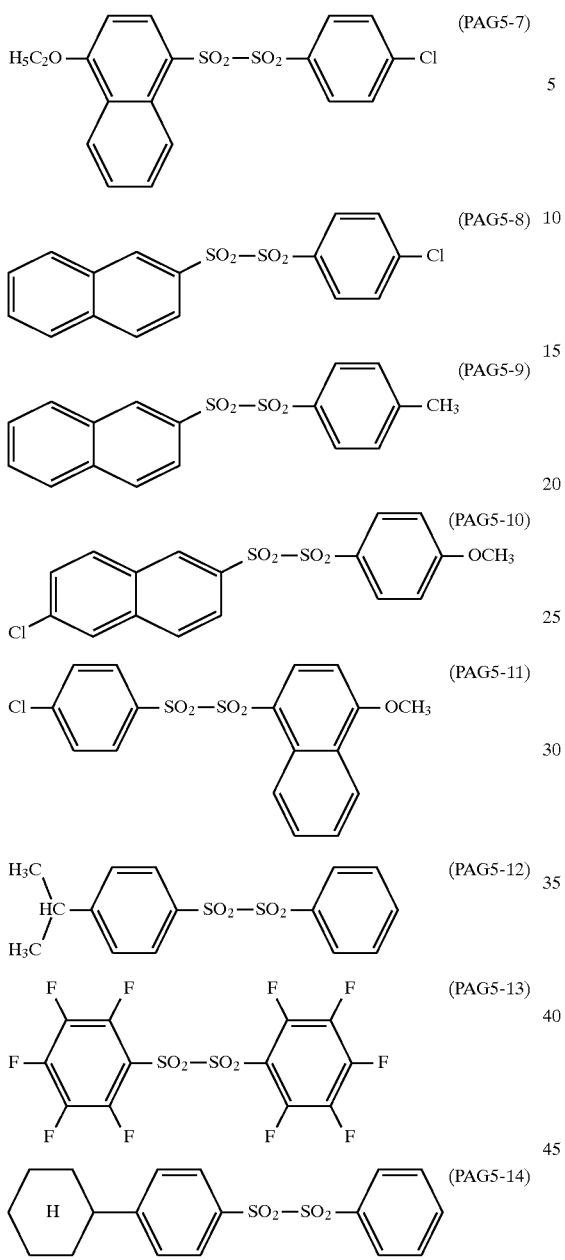

(b) Resin which has groups capable of decomposing by action of an acid to increase solubility in an alkali developer and comprises repeating units of structural formulae (II) and (III) illustrated hereinbefore The optionally substituted straight-chain, branched or cyclic alkyl group and the optionally substituted aralkyl group represented by each of the groups A and $R_{22}$ in the formula (II) illustrated hereinbefore have the same meanings as those represented by Y and $R_1$ to $R_{21}$ each in the formula (I), respectively. The substituents suitable for the alkyl group and those for the aralkyl group also have the same meaning as those in the formula (I), respectively.

Further, A may combine with $R_{22}$ to complete a 5- or 6-membered ring such as tetrahydropyran and tetrahydrofuran.

In addition to the constitutional repeating units of formulae (II) and (III), the present resin which has groups capable of decomposing by action of an acid to increase solubility in an alkali developer can have other monomer units as copolymerizing components. Examples of such monomer units include a hydrogenated hydroxystyrene, a halogen-, alkoxy- or alkyl-substituted hydroxystyrene, styrene, a halogen-, alkoxy-, acyloxy- or alkyl-substituted styrene, maleic anhydride, an acrylic acid derivative, a methacrylic acid derivative and an N-substituted maleimide, but these examples are not to be construed as limiting the scope of the invention. In the combination of the present components of formulae (II) and (III) with other monomer components, the ratio of the present components to other monomer components, [(II)+(III)]/[other monomer components], ranges from 99/1 to 50/50, preferably from 95/5 to 60/40, and more preferably from 90/10 to 70/30.

Into the resin to be used in the present invention, a crosslinking portion connecting a polymer main chain with a polyfunctional acetal group may be introduced by adding a polyhydroxy compound at the synthesis of resin in order to control the rate of alkali solubility and improve heat resistance.

The proportion of the polyhydroxy compound added is from 0.01 to 10 mole %, preferably from 0.05 to 8 mole % and more preferably from 0.1 to 5 mole %, based on the number of hydroxy groups in the resin.

Suitable polyhydroxy compounds are the compounds having 2 to 6, preferably 2 to 4, more preferably 2 or 3, phenolic or alcoholic hydroxy groups. Specific examples of such a polyhydroxy compound are illustrated below, but these examples are not be construed as limiting the scope of the invention in any way.

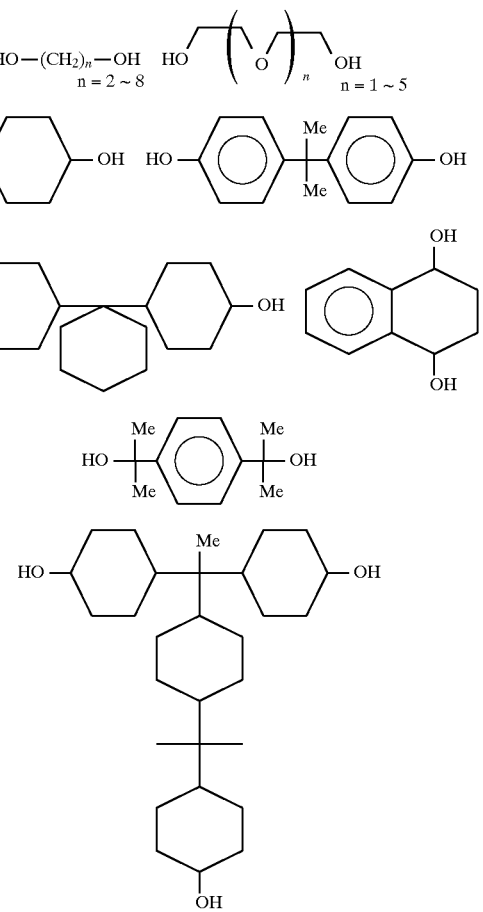

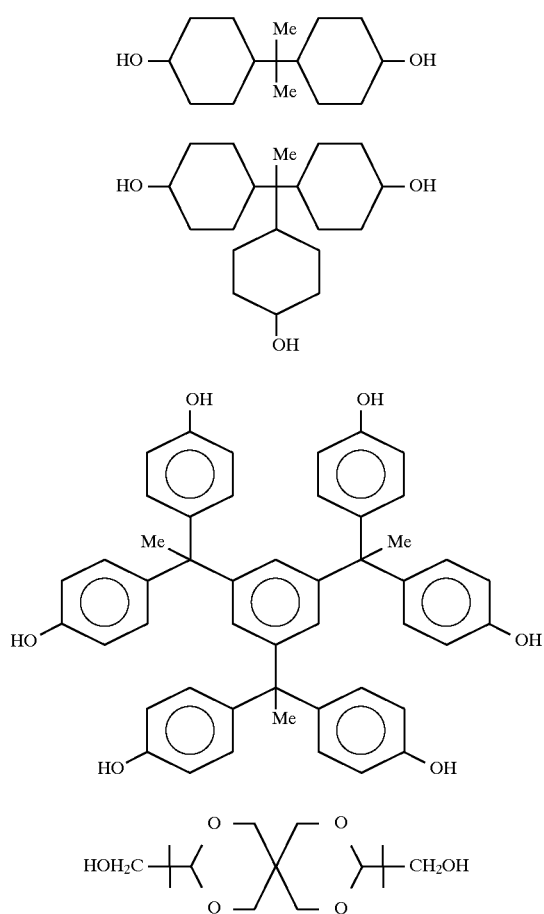
Specific examples of the present resin having acid-decomposable groups are illustrated below. However, the present resin should not be construed as being limited to these examples.
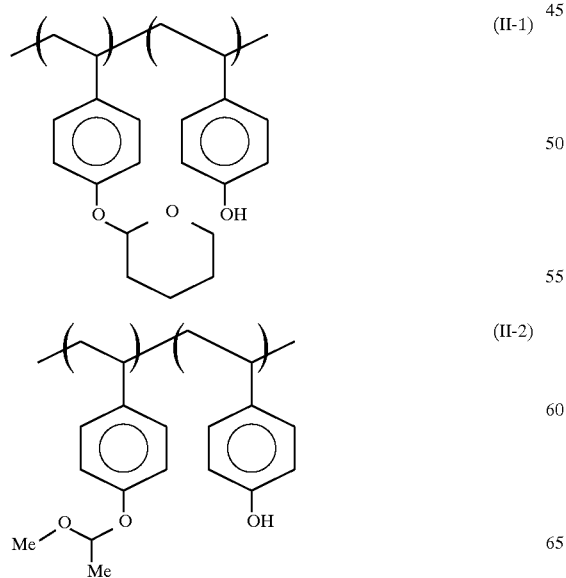
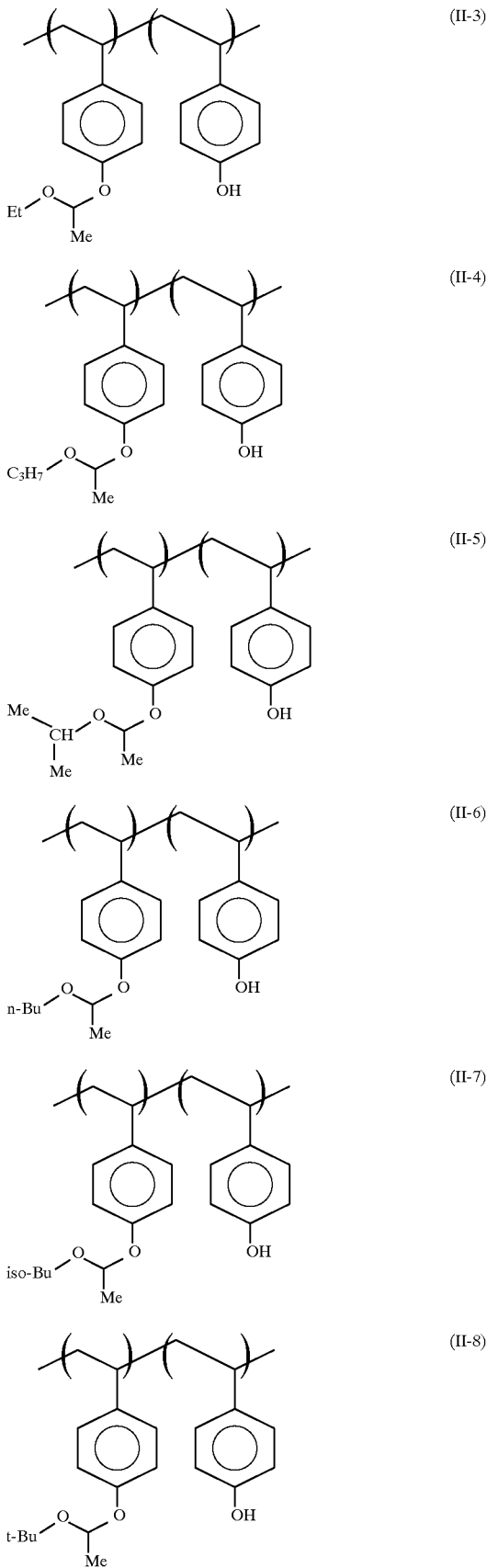

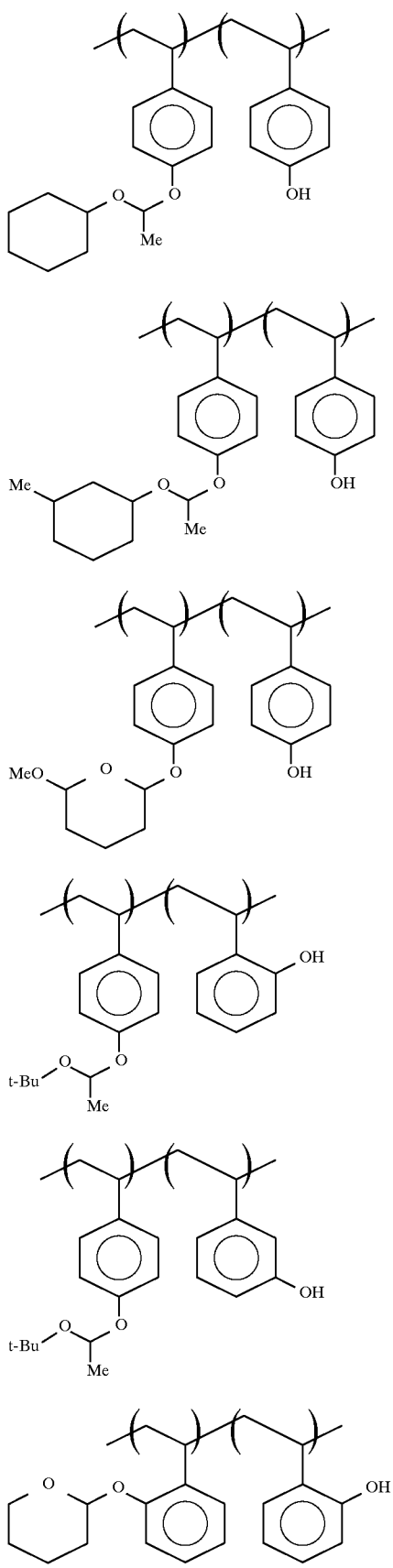

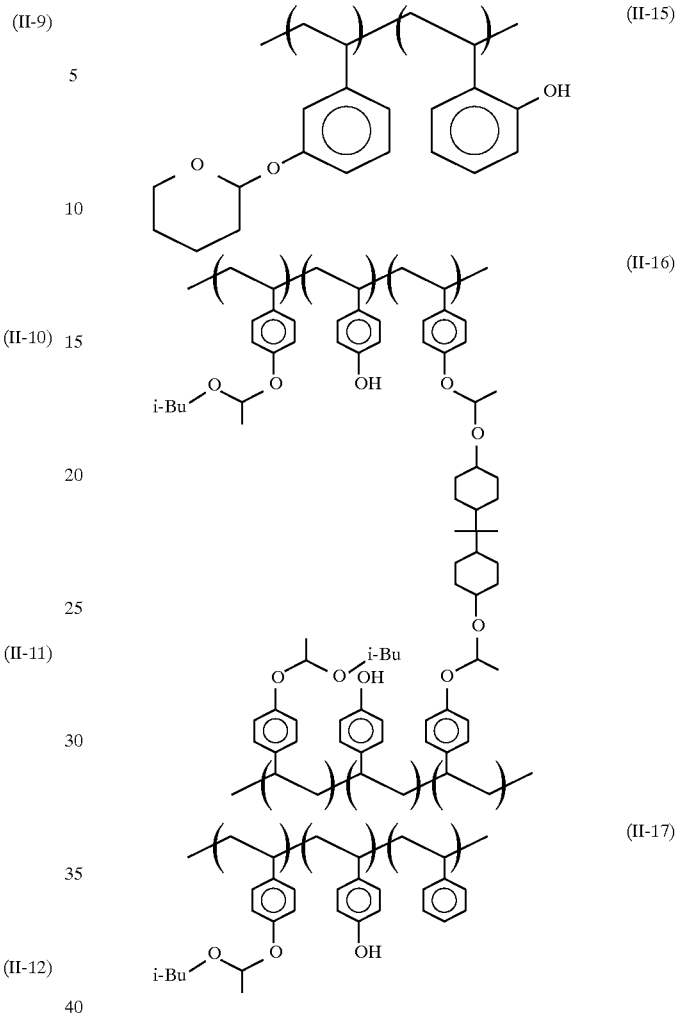

When the number of acid-decomposable groups present in the repeating units of formula (II) is denoted by B and the number of alkali-soluble groups present in the repeating units of formula (III) without protected by acid-decomposable groups is denoted by S, the content of acid-decomposable groups in the resin is represented by B/(B+S). The suitable content is from 0.01 to 0.7, preferably from 0.05 to 0.6, and more preferably from 0.1 to 0.6. The content range of greater than 0.7, B/(B+S)>0.7, is undesirable since it gives rise to the film shrinkage after PEB, poor adhesion to a substrate and scumming. In the content range of smaller than 0.01, on the other hand, there-happens an undesirable phenomenon that stationary waves reside predominantly on the pattern side wall.

The weight-average molecular weight (Mw) of the resin having acid-decomposable groups is preferably in the range of 2,000 to 200,000. When Mw is less than 2,000, the reduction of film thickness in the unexposed area by development becomes great; while, when Mw is more than 200,000, the dissolution rate of the resin itself in an alkali becomes slow to lower the sensitivity. It is thus preferable that the Mw of the present resin be in the range of 5,000 to 150,000, especially 8,000 to 150,000.

Therein, the weight-average molecular weight is defined as the value determined by gel permeation chromatography on a polystyrene basis.

Further, the resins according to the present invention, wherein acid-decomposable groups are present, may be used alone or as a mixture of two or more thereof. These resins are used in a proportion of from 40 to 99 weight %, preferably from 60 to 95 weight %, to the total weight of the photosensitive composition (excepting a coating solvent).

The resins according to the present invention may be used together with other resins having acid-decomposable groups.

The other resins which have groups capable of being decomposed by an acid to increase the solubility in an alkali developer and can be used in the present chemically amplified resin include resins having acid-decomposable groups in either main or side chains thereof and resins having acid-decomposable groups in both main and side chains thereof. Of such resins, those having acid-decomposable groups in their side chains are preferable.

As for the acid-decomposable groups, a group of formula —COO—$A^0$ and a group of formula —O—$B^0$ are suitable examples thereof. As for the moieties containing such groups, those represented by —$R^0$—COO—$A^0$ or —Ar—O—$B^0$ are examples thereof.

Herein, $A^0$ represents a group of formula —C($R^{01}$)($R^{02}$)($R^{03}$), —Si($R^{01}$)($R^{02}$)($R^{03}$) or —C($R^{04}$)($R^{05}$)—O—$R^{06}$; and $B^0$ represents —$A^0$ or a group of formula —CO—O—$A^0$, wherein $R^0$, $R^{01}$, $R^{02}$, $R^{03}$, $R^{04}$, $R^{05}$, $R^{06}$ and Ar have the same meanings as defined hereinafter.

Specific examples of acid-decomposable groups as described above include a silyl ether group, a cumyl ester group, an acetal group, a tetrahydropyranyl ether group, a tetrahydropyranyl ester group, an enol ether group, an enol ester group, a t-alkyl ether group, a t-alkyl ester group and a t-alkyl carbonate group. Of these groups, a t-alkyl ester group, a t-alkyl carbonate group, a cumyl ester group, an acetal group and a tetrahydropyranyl ether group are preferred over the others.

With respect to a mother resin to which those acid-decomposable groups are attached as side chains, alkali-soluble resins having —OH groups or —COOH groups, preferably —$R^0$—COOH or —Ar—OH groups, in their side chains are examples thereof. Such alkali-soluble resins are described below in detail.

It is desirable for those alkali-soluble resins that their dissolution rates in an alkali be at least 170 Å/second, particularly preferably at least 330 Å/second, when measured with 0.261N tetramethylammonium hydroxide (TMAH) at 23° C.

Further, it is desirable from the viewpoint of achieving a rectangular profile to use an alkali-soluble resin which can transmit a high percentage of far ultraviolet light or excimer laser beam. More specifically, when an alkali-soluble resin is formed into a 1 μm-thick film, it is desirable that the resin film has a percent transmittance of from 20 to 90% at 248 nm.

As for the alkali-soluble resins particularly advantageous from the foregoing viewpoint, homo- and copolymers of o-, m- and p-hydroxystyrenes, a hydrogenated poly (hydroxystyrene), a halogen- or alkyl-substituted poly (hydroxystyrene), a partially O-alkylated or O-acylated poly (hydroxystyrene), a styrene-hydroxystyrene copolymer, an α-methylstyrene-hydroxystyrene copolymer and a hydrogenated novolak resin are examples thereof.

The resins used in the present invention, wherein acid-decomposable groups are present, can be prepared by reacting precursors of acid-decomposable groups with alkali-soluble resins, or by copolymerizing an alkali-soluble resin monomer to which an acid-decomposable group is attached and other various monomers.

It is desirable that an acid-decomposable low-molecular dissolution inhibiting compound as illustrated below may be admixed with the aforementioned acid generator and the resins having acid-decomposable groups.

The acid-decomposable dissolution inhibiting compound usable in the present invention is a compound having such a structure that at least two acid-decomposable groups are present therein and at least 8 bonding atoms, except the atoms contained in the acid-decomposable groups, lie between the two acid-decomposable groups located most remotely from each other.

In particular, it is desirable for the acid-decomposable dissolution inhibiting compounds used in the present invention that at least two acid-decomposable groups be present therein and at least 10 bonding atoms, preferably at least 11 bonding atoms, more preferably at least 12 bonding atoms, except the atoms contained in the acid-decomposable groups, lie between the two acid-decomposable groups located most remotely from each other; or at least three acid-decomposable groups be present therein and at least 9 bonding atoms, preferably at least 10 bonding atoms, more preferably at least 11 bonding atoms, except the atoms contained in the acid-decomposable groups, lie between the two acid-decomposable groups located most remotely from each other. Further, the upper limit of the number of the aforesaid bonding atoms is preferably 50, more preferably 30.

When an acid-decomposable dissolution inhibiting compound has at least 3, preferably at least 4, acid-decomposable groups, and even when it has two acid-decomposable groups, its ability to inhibit the dissolution of an alkali-soluble resin is remarkably enhanced by locating those acid-decomposable groups at a certain definite distance or longer.

Additionally, the distance between acid-decomposable groups in the present invention is expressed in terms of the number of bonding atoms via which one acid-decomposable group is connected to the other acid-decomposable group. For instance, the distance between acid-decomposable groups in each of the following Compounds (1) and (2) is represented by 4 bonding atoms; while that in the following Compound (3) is represented by 12 bonding atoms:

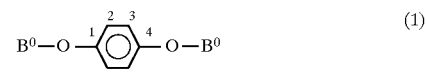

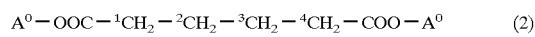

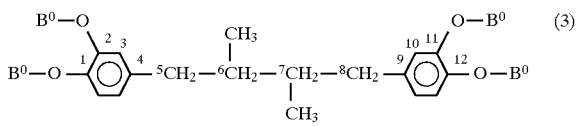

In addition, the acid-decomposable dissolution inhibiting compound used in the present invention may have two or more acid-decomposable groups on one benzene ring. However, the present invention prefers a compound having a skeleton in which each benzene ring has thereon one acid-decomposable group. Further, it is desirable for the acid-decomposable dissolution inhibiting compound used in the present invention to have a molecular weight of no higher than 3,000, preferably from 500 to 3,000, more preferably from 1,000 to 2,500.

In preferred embodiments of the present invention, the moieties containing acid-decomposable groups of formula COO—$A^0$ or —O—$B^0$ are those represented by formulae —$R^0$—COO—$A^0$ and —Ar—O—$B^0$, respectively.

Herein, $A^0$ represents a group of formula —C($R^{01}$)($R^{02}$)($R^{03}$), —Si($R^{01}$)($R^{02}$)($R^{03}$) or —C($R^{04}$)($R^{05}$)—O$R^{06}$; and $B^0$ represents $A^0$ or —CO—O—$A^0$.

$R^{01}$, $R^{02}$, $R^{03}$, $R^{04}$ and $R^{05}$ may be the same or different, and each of them represents a hydrogen atom, an alkyl group, a cycloalkyl group, an alkenyl group or an aryl group; and $R^{06}$ represents an alkyl group or an aryl group: provided that at least two among $R^{01}$, $R^{02}$ and $R^{03}$ are groups other than a hydrogen atom. Further, two among $R^{01}$, $R^{02}$ and $R^{03}$ may combine with each other to complete a ring, and two among $R^{04}$, $R^{05}$ and $R^{06}$ may also combine with each other to complete a ring. $R^0$ represents an optionally substituted divalent aliphatic or aromatic hydrocarbon group, and —Ar— represents a monocyclic or polycyclic, optionally substituted aromatic group having at least two bonds.

Therein, suitable examples of an alkyl group include those containing 1 to 4 carbon atoms, such as a methyl group, an ethyl group, a propyl group, a n-butyl group, a sec-butyl group and a t-butyl group; suitable examples of a cycloalkyl group include those containing 3 to 10 carbon atoms, such as a cyclopropyl group, a cyclobutyl group, a cyclohexyl group and an adamantyl group; suitable examples of an alkenyl group include those containing 2 to 4 carbon atoms, such as a vinyl group, a propenyl group, an allyl group and a butenyl group; and suitable examples of an aryl group include those containing 6 to 14 carbon atoms, such as a phenyl group, a xylyl group, a toluyl group, a cumenyl group, a naphthyl group and an anthracenyl group.

As examples of a substituent which the groups as recited above can have, mention may be made of a hydroxy group, halogen atoms (e.g, fluorine, chlorine, bromine, iodine), a nitro group, a cyano group, the alkyl groups as recited above, alkoxy groups (e.g., methoxy, ethoxy, hydroxyethoxy, propoxy, hydroxypropoxy, n-butoxy, isobutoxy, sec-butoxy, t-butoxy), alkoxycarbonyl groups (e.g., methoxycarbonyl, ethoxycarbonyl), aralkyl groups (e.g., benzyl, phenetyl, cumyl), aralkyloxy groups, acyl groups (e.g., formyl, acetyl, butyryl, benzoyl, cinnamyl, valeryl), acyloxy groups (e.g., butyryloxy), the alkenyl groups as recited above, alkenyloxy groups (e.g., vinyloxy, propenyloxy, allyloxy, butenyloxy), the aryl groups as recited above, aryloxy groups (e.g., phenoxy), and aryloxycarbonyl groups (e.g., benzoyloxy).

Suitable examples of such acid-decomposable groups include a silyl ether group, a cumyl ester group, an acetal group, a tetrahydropyranyl ether group, an enol ether group, an enol ester group, a t-alkyl ether group, a t-alkyl ester group and a t-alkyl carbonate group. Of these groups, a t-alkyl ester group, a t-alkyl carbonate group, a cumyl ester group and a tetrahydropyranyl ether group are preferred over the others.

Suitable examples of an acid-decomposable dissolution inhibiting compound include the compounds obtained by combining part or all of phenolic OH groups of the polyhydroxy compounds described below with the groups as recited above, or the groups of formula —$R^0$—COO—$A^0$ or $B^0$, to protect the OH groups. As for those polyhydroxy compounds, the compounds described in JP-A-1-289946, JP-A-1-289947, JP-A-2-2560, JP-A-3-128959, JP-A-3-158855, JP-A-3-179353, JP-A-3-191351, JP-A-3-200251, JP-A-3-200252, JP-A-3-200253, JP-A-3-200254, JP-A-3-200255, JP-A-3-259149, JP-A-3-279958, JP-A-3-279959, JP-A-4-1650, JP-A-4-1651, JP-A-4-11260, JP-A-4-12356, JP-A-4-12357, JP-A-4-281349, JP-A-5-45869, JP-A-5-1582233, JP-A-5-224409, JP-A-5-257275, JP-A-5-297581, JP-A-5-297583, JP-A-5-303197, JP-A-5-303200 and JP-A-5-341510 are specific examples thereof.

Of the aforementioned acid-decomposable dissolution inhibiting compounds, those using the polyhydroxy compounds described in described in JP-A-1-289946, JP-A-3-128959, JP-A-3-158855, JP-A-3-179353, JP-A-3-200251, JP-A-3-200252, JP-A-3-200255, JP-A-3-259149, JP-A-3-279958, JP-A-4-1650, JP-A-4-11260, JP-A-4-12356, JP-A-4-12357, JP-A-5-224409, JP-A-5-297581, JP-A-5-297583, JP-A-5-303197, JP-A-5-303200 and JP-A-5-341510 are preferred over the others.

More specifically, the compounds illustrated by the following formulae [I] to [XVI] respectively are suitable examples of acid-decomposable dissolution inhibiting compounds.

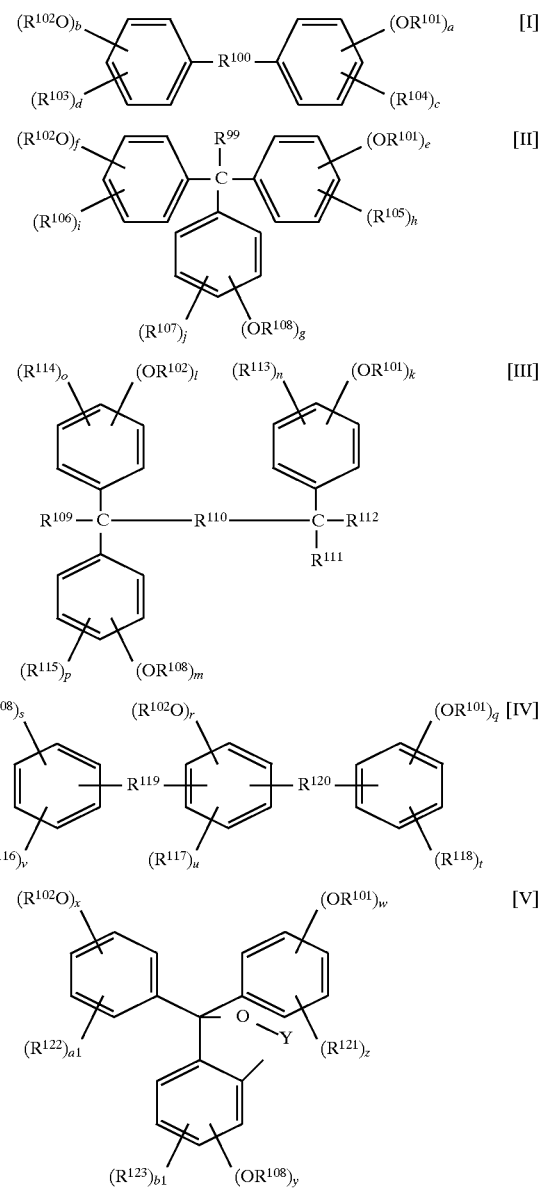

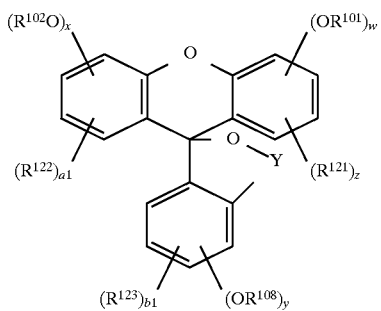
[VI]

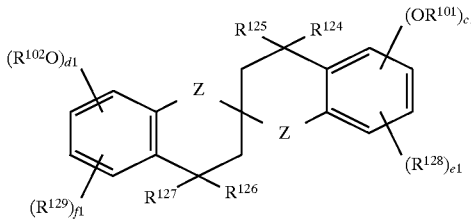
[VII]

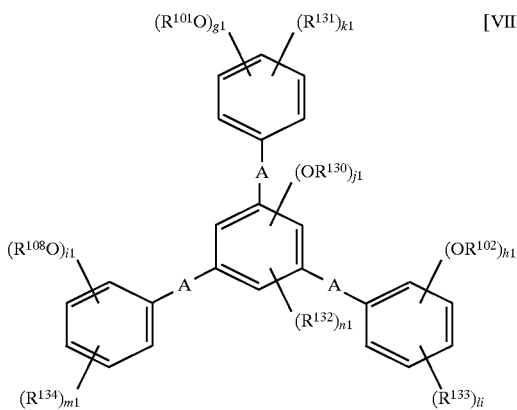
[VIII]

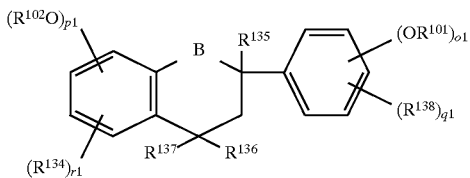
[IX]

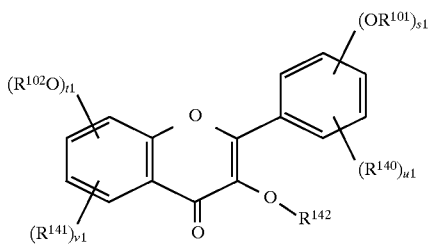
[X]

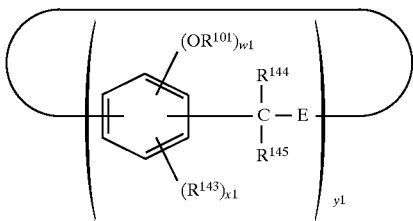
[XI]

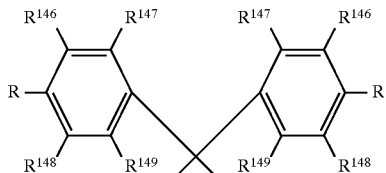
[XII]

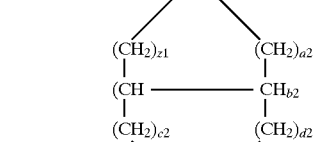

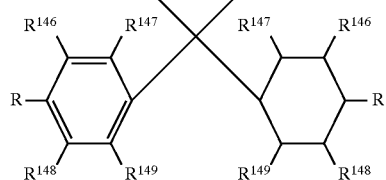

$R^{101}$, $R^{102}$, $R^{108}$ and $R^{130}$ are identical to or different from one another, and each of them is a hydrogen atom, —$R^0$—COO—C($R^{01}$)($R_{02}$)($R^{03}$) or —CO—O—C($R^{01}$)($R^{02}$)($R^{03}$), wherein $R^0$, $R^{01}$, $R^{02}$ and $R^{03}$ have the same meanings as defined hereinbefore, respectively.

$R^{100}$ is —CO—, —COO—, —NHCONH—, —NHCOO—, —O—, —S—, —SO—, —SO$_2$—, —SO$_3$—, or

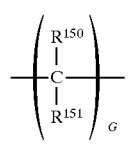

wherein G is from 2 to 6, provided that at least either $R^{150}$ or $R^{151}$ is an alkyl group when G is 2; $R^{150}$ and $R^{151}$ are identical to or different from each other, and each of them is a hydrogen atom, an alkyl group, an alkoxy group, —OH, —COOH, —CN, a halogen atom, —$R^{152}$—COO$R^{153}$ or —$R^{154}$—OH; $R^{152}$ and $R^{154}$ are each an alkylene group; and $R^{153}$ is a hydrogen atom, an alkyl group, an aryl group or an aralkyl group.

$R^{99}$, from $R^{103}$ to $R^{107}$, $R^{109}$, from $R^{111}$ to $R^{118}$, from $R^{121}$ to $R^{123}$, $R^{128}$, $R^{129}$, from $R^{131}$ to $R^{134}$, from $R^{138}$ to $R^{141}$, and $R^{143}$ are identical to or different from one another, and each of them is a hydrogen atom, a hydroxy group, an alkyl group, an alkoxy group, an acyl group, an acyloxy group, an aryl group, an aryloxy group, an aralkyl group, an aralkyloxy group, a halogen atom, a nitro group, a carboxyl group, a cyano group or —N($R^{155}$)($R^{156}$) ($R^{155}$, $R^{156}$: H, an alkyl group or an aryl group).

$R^{110}$ is a single bond, an alkylene group or

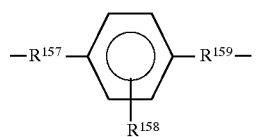

wherein $R^{157}$ and $R^{159}$ are identical to or different from each other, and each of them is a single bond, an alkylene group, —O—, —S—, —CO— or a carboxyl group; and $R^{158}$ is a hydrogen atom, an alkyl group, an alkoxy group, an acyl group, an acyloxy group, an aryl group, a nitro group, a hydroxy group, a cyano group or a carboxyl group, wherein the hydroxy group may be replaced by an acid-decomposable group (such as a t-butoxycarbonylmethyl, tetrahydropyranyl, 1-ethoxy-1-ethyl or 1-t-butoxy-1-ethyl group).

$R^{119}$ and $R^{120}$ are identical to or different from each other, and each of them is a methylene group, a lower alkyl-substituted methylene group, a halomethylene group or a haloalkylene group, wherein the term lower alkyl group refers the an alkyl group containing 1 to 4 carbon atoms.

$R^{124}$ to $R^{127}$ are identical to or different from one other, and each of them is a hydrogen atom or an alkyl group.

$R^{135}$ to $R^{137}$ are identical to or different from one other, and each of them is a hydrogen atom, an alkyl group, an alkoxy group, an acyl group or an acyloxy group.

$R^{142}$ is a hydrogen atom, $-R^0-COO-C(R^{01})(R^{02})(R^{03})$, $-CO-O-C(R^{01})(R^{02})(R^{03})$, or the group of formula;

E is a single bond or a hydroxymethylene group.

When a to z and a1 to y1 are each two or more, parenthesized groups may be identical to or different from one another. From a to q, s, t v, from g1 to i1, from k1 to m1, o1, q1, s1, and u1 are each 0 or an integer of 1 to 5; r, u, w, x, y, z, from a1 to f1, p1, r1, t1, and from v1 to x1 are each 0 or an integer of 1 to 4; j1, n1, z1, a2, b2, c2 and d2 are each 0 or an integer of 1 to 3, provided that at least one among z1, a2, c2 and d2 is 1 or more; and y1 is an integer of 3 to 8: provided that a+b≧2, e+f+g≧2, k+l+m≧2, q+r+s≧2, w+x+y≧2, c1+d1≧2, g1+h1+i1+j1≧2, o1+p1≧2, s1+t1>2, j1+n1≦3, r+u≦4, w+z≦4, x+a1≦4, y+b1≦4, c1+e1≦4, d1+f1≦4, p1+r1≦4, t1+v1≦4, x1+w1≦4, but w+z≦5 and x+a1≦5 in the formula [V], a+c≦5, b+d≦5, e+h≦5, f+i≦5, g+j≦5, k+n≦5, l+o≦5, m+p≦5, q+t≦5, s+v≦5, g1+k1≦5, h1+i1≦5, i1+m1≦5, o1+q1≦5 and s1+u1≦5.

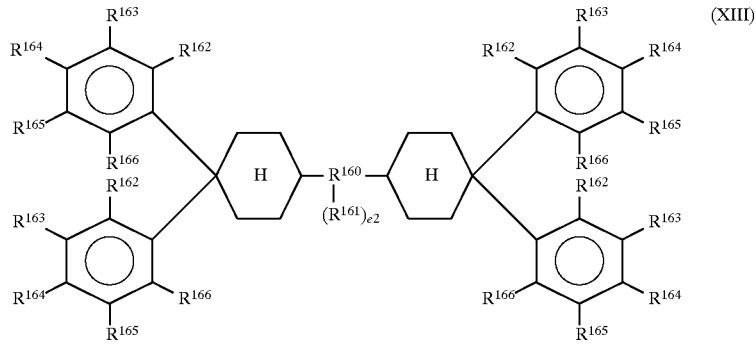
(XIII)

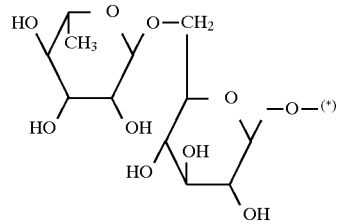

wherein the mark (*) means the site to which —O— is linked.

$R^{144}$ and $R^{145}$ are identical to or different from each other, and each of them is a hydrogen atom, a lower alkyl group, a lower haloalkyl group or an aryl group.

$R^{146}$ to $R^{149}$ are identical to or different from one another, and each of them is a hydrogen atom, a hydroxy group, a halogen atom, a nitro group, a cyano group, a carbonyl group, an alkyl group, an alkoxy group, an alkoxycarbonyl group, an aralkyl group, an aralkyloxy group, an acyl group, an acyloxy group, an alkenyl group, an alkenyloxy group, an aryl group, an aryloxy group or an aryloxycarbonyl group, wherein each set of four substituents denoted by the same symbol may not be the same as one another so far as they are included in the groups recited above.

Y is —CO— or —SO$_2$—.

Z and B are each a single bond or —O—.

A is a methylene group, a lower alkyl-substituted methylene group, a halomethylene group or a haloalkylene group.

wherein $R^{160}$ is an organic group, a single bond, —S—, —SO— or —SO$_2$—; $R^{161}$ is a hydrogen atom, a monovalent organic group, or a group of the following formula,

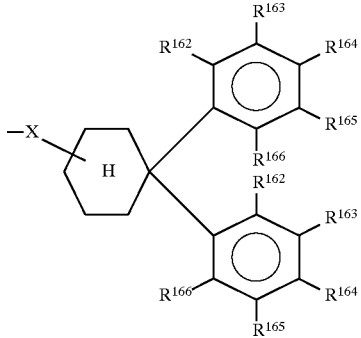

wherein X is a divalent organic group; $R^{162}$ to $R^{166}$ are identical to or different from one another, and each of them is a hydrogen atom, a hydroxy group, a halogen atom, an alkyl group, an alkoxy group, an alkenyl group, —O—R$^0$—COO—C(R$^{01}$)(R$^{02}$)(R$^{03}$) or —O—CO—O—C(R$^{01}$)(R$^{02}$)(R$^{03}$), provided that at least two of them are —O—R$^0$—COO—C(R$^{01}$)(R$^{02}$)(R$^{03}$) or —O—CO—O—C(R$^{01}$)(R$^{02}$)(R$^{03}$), but each set of four or six substituents denoted by the same symbol may not be the same group so far as they are included in the groups recited above; and e2 is 0 or 1.

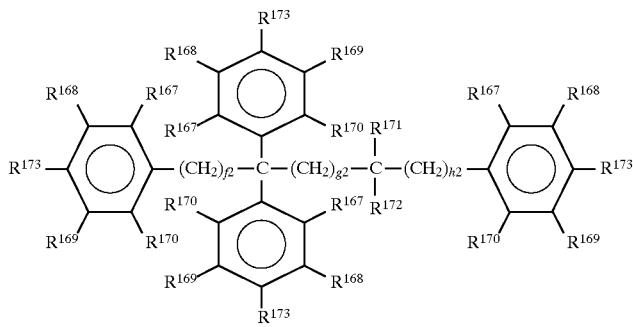

(XIV)

wherein $R^{167}$ to $R^{170}$ are identical to or different from one another, and each of them is a hydrogen atom, a hydroxy group, a halogen atom, an alkyl group, an alkoxy group or an alkenyl group, but each set of 4 or 6 substituents denoted by the same symbol may not be the same group so far as they are included in the groups recited above; $R^{171}$ and $R^{172}$ are each a hydrogen atom, an alkyl group or a group of formula

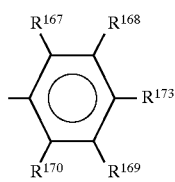

at least two of $R^{173}$ groups are —O—$R^0$—COO—C($R^{01}$)($R^{02}$)($R^{03}$) or —O—CO—O—C($R^{01}$)($R^{02}$)($R^{03}$) and the rest of them are hydroxy groups; f2 and h2 are each 0 or 1; and g2 is 0 or an integer of 1 to 4.

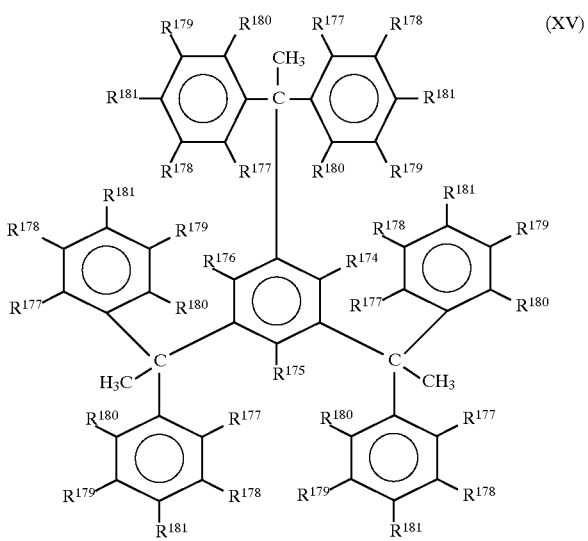

(XV)

wherein $R^{174}$ to $R^{180}$ are identical to or different from one another, and each of them is a hydrogen atom, a hydroxy group, a halogen atom, an alkyl group, an alkoxy group, a nitro group, an alkenyl group, an aryl group, an aralkyl group, an alkoxycarbonyl group, an arylcarbonyl group, an acyloxy group, an acyl group, an aralkyloxy group or an aryloxy group, and wherein each set of six substituents denoted by the same symbol may not be the same so far as they are included in the groups recited above; at least two of $R^{181}$ groups are —O—$R^0$—COO—C($R^{01}$)($R^{02}$)($R^{03}$) or —O—CO—O—C($R^{01}$)($R^{02}$)($R^{03}$) and the rest of them are hydroxy groups.

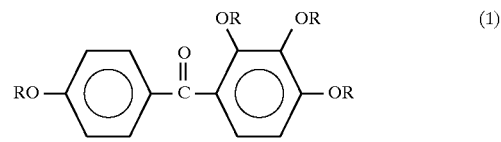

(XVI)

wherein the substituents denoted by $R^{182}$ are each a hydrogen atom or an alkyl group, and all of them may not be the same; the substituents denoted by $R^{183}$ to $R^{186}$ are each a hydroxy group, a hydrogen atom, a halogen atom, an alkyl group or an alkoxy group, but each set of three substituents denoted by the same symbol may not be the same so far as they are included in the groups recited above; and at least two of the substituents denoted by $R^{187}$ are —O—$R^0$—COO—C($R^{01}$)($R^{02}$)($R^{03}$) or —O—CO—O—C($R^{01}$)($R^{02}$)($R^{03}$) and the rest of them are hydroxy groups.

Specific examples of a suitable compound skeleton are illustrated below:

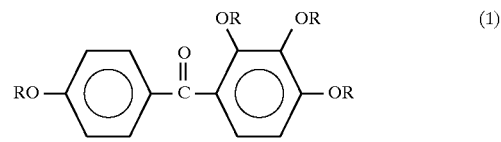

(1)

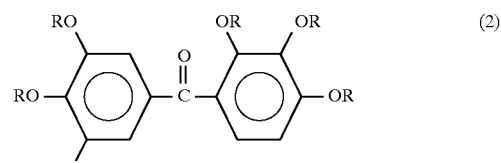

(2)

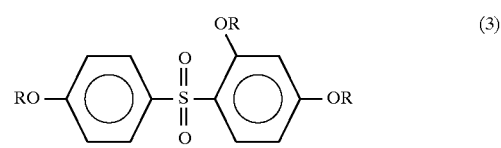

(3)

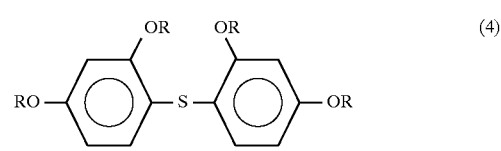

(4)

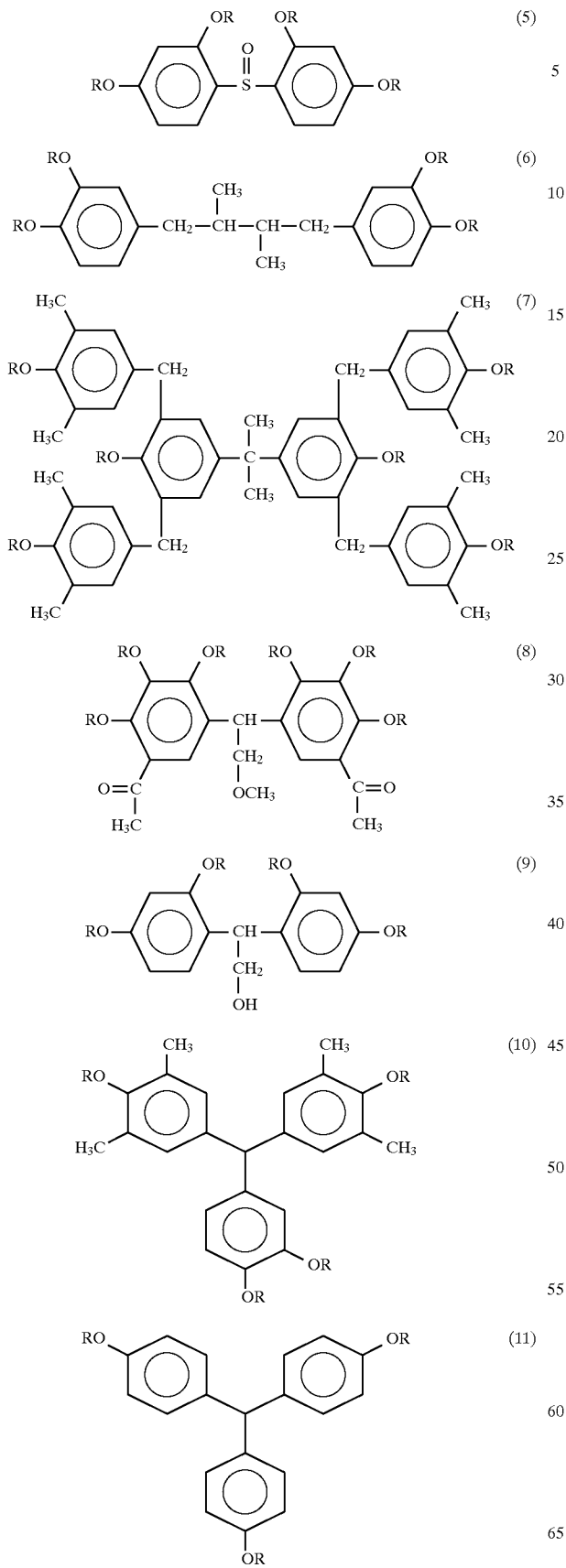
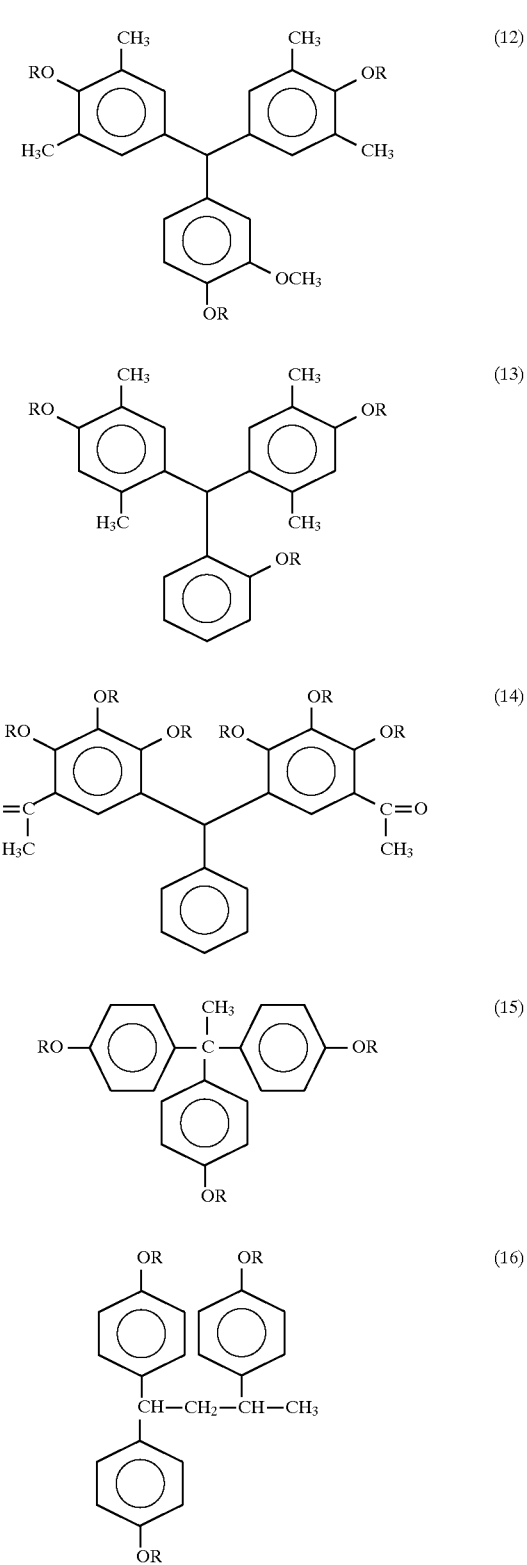

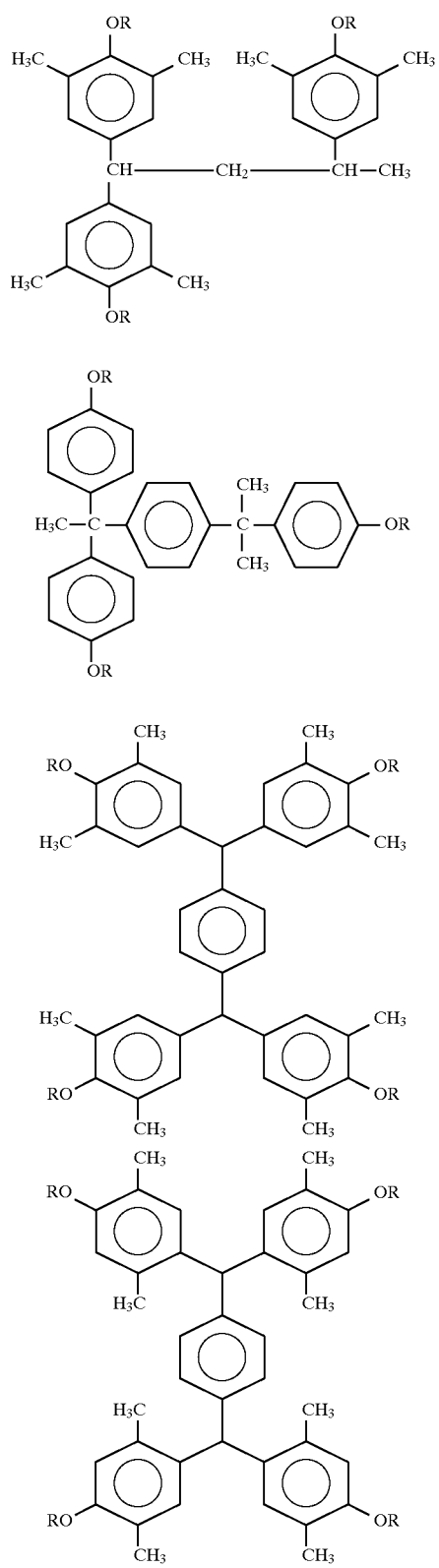
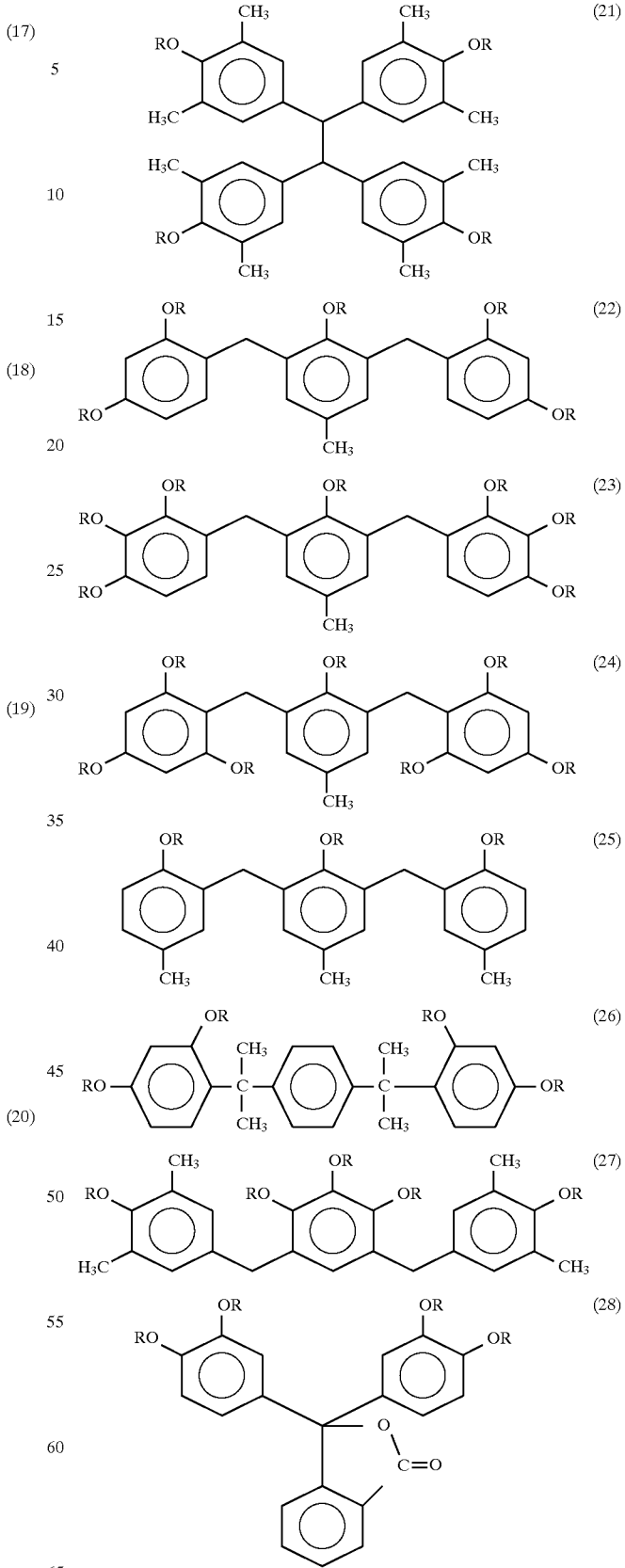

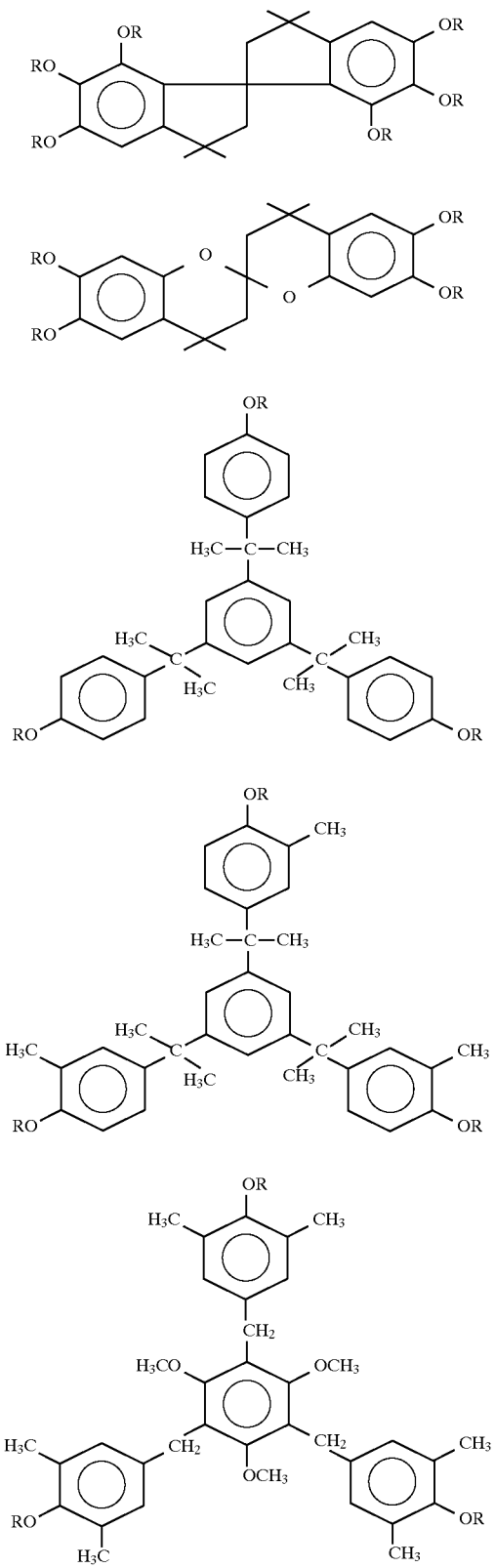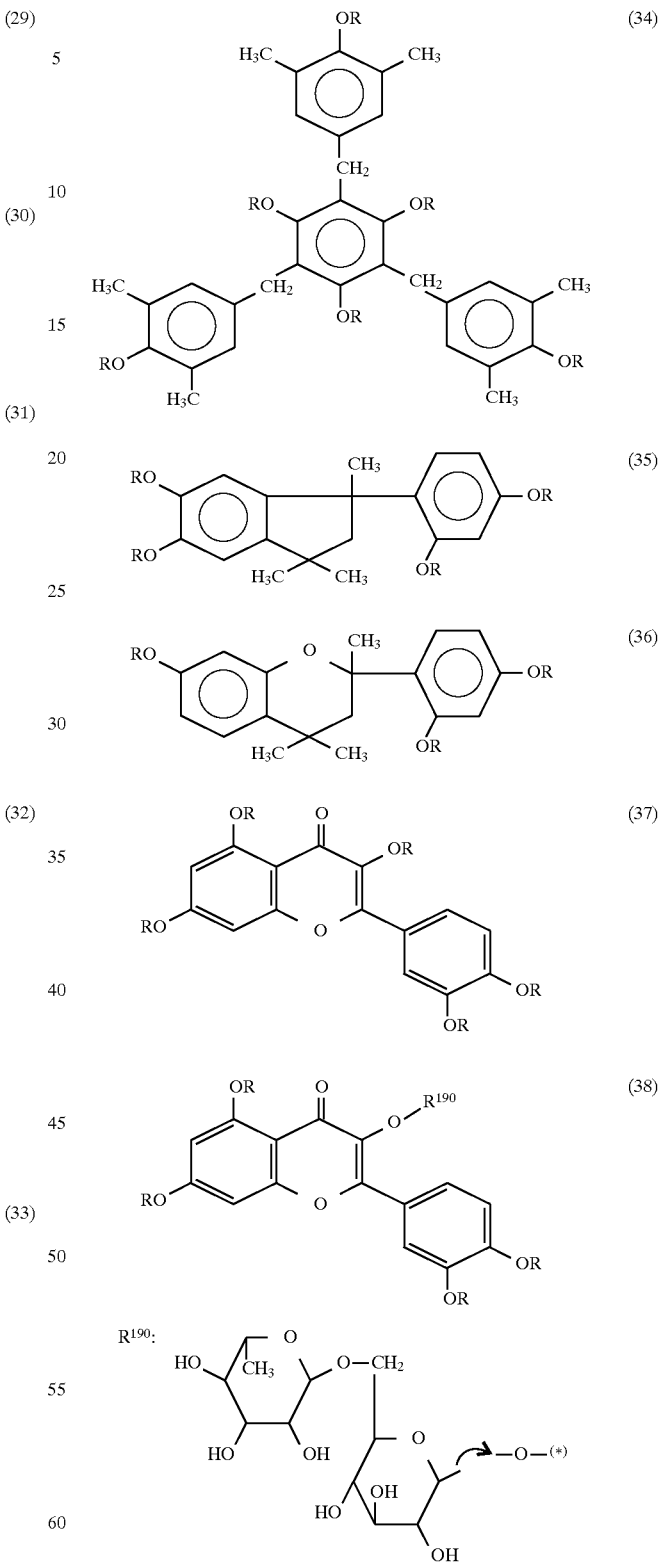

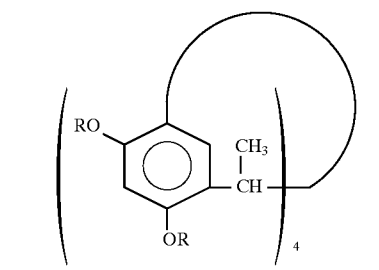
(39)
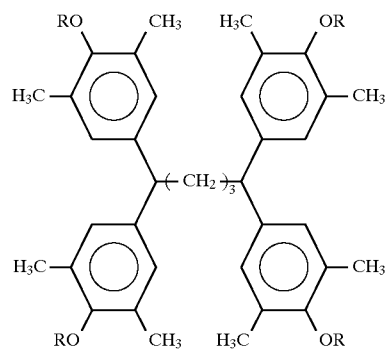
(40)
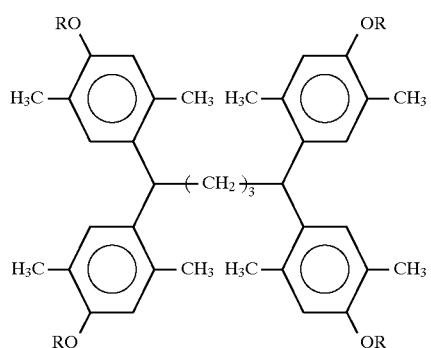
(41)
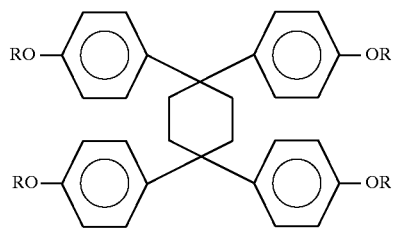
(42)
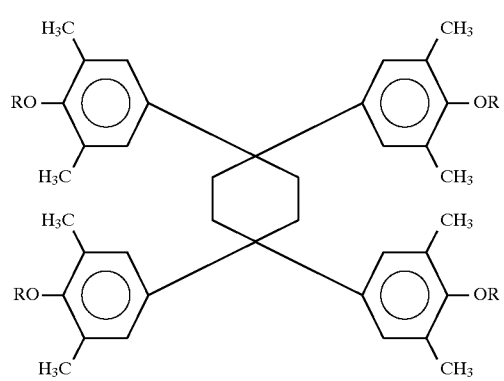
(43)
(44)
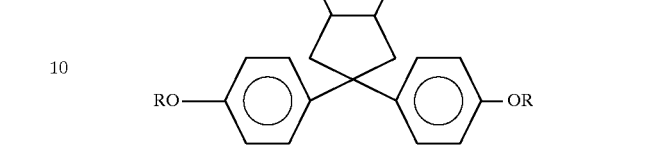
(45)
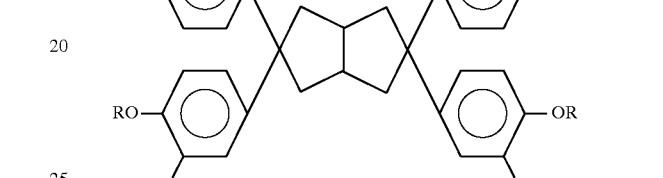
(46)
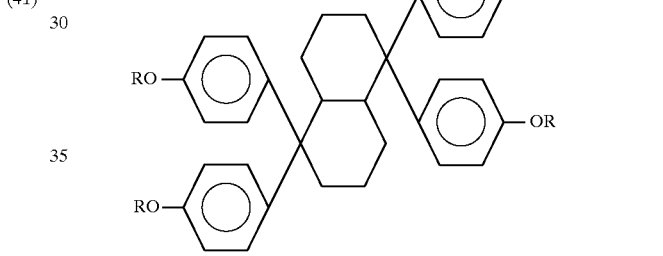
(47)
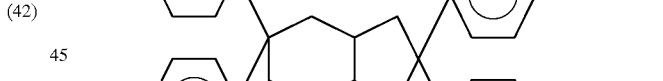
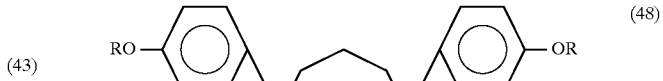
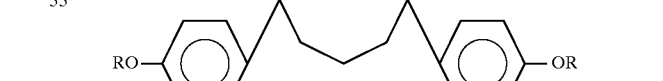
(48)

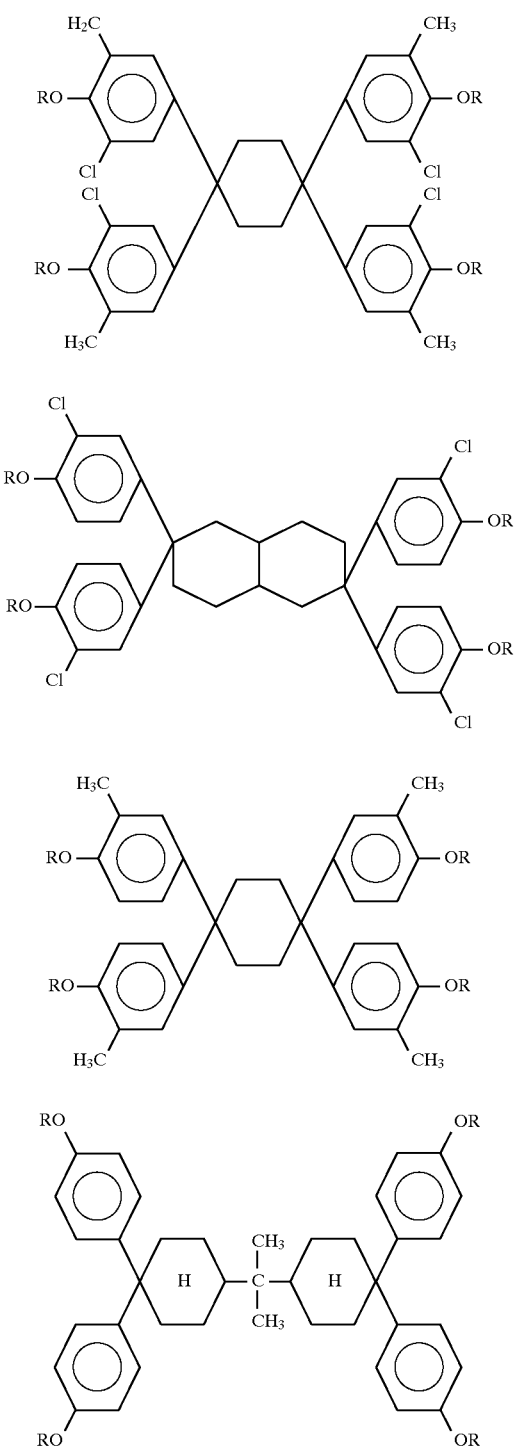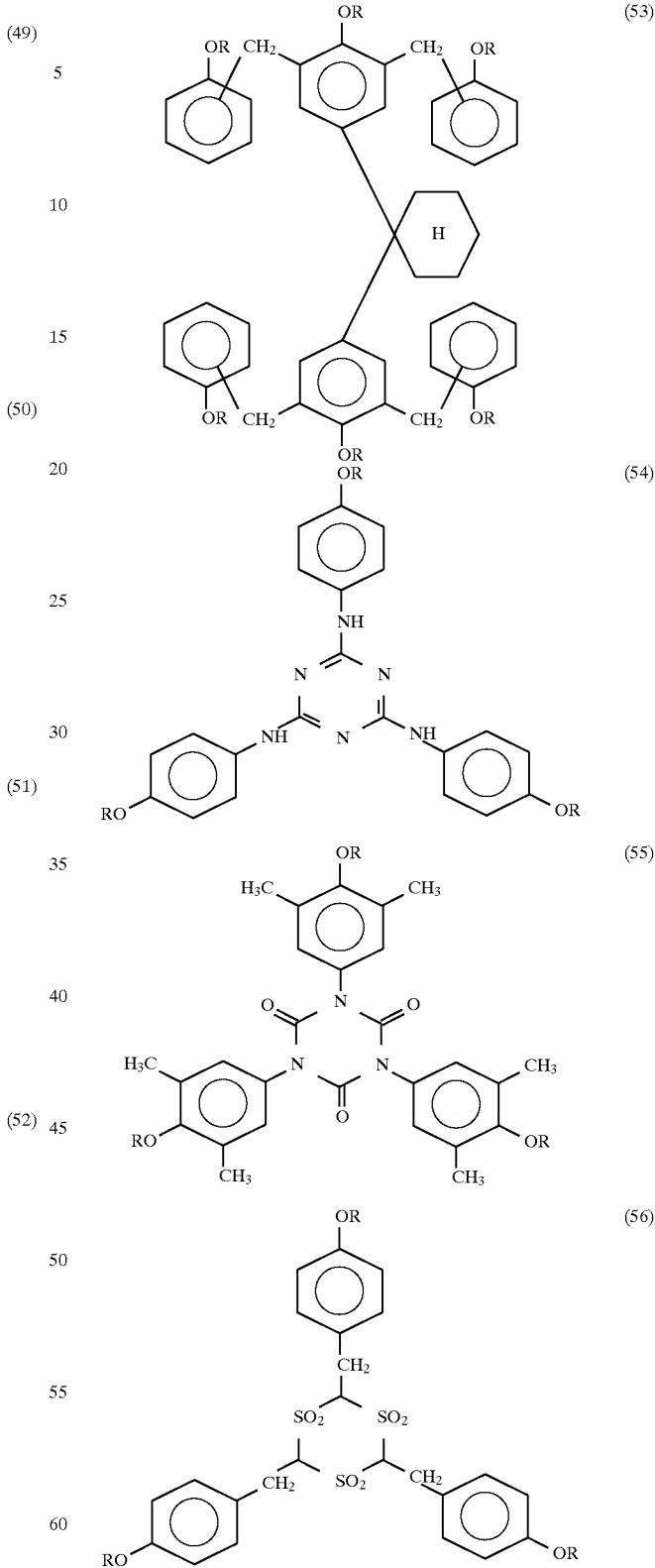

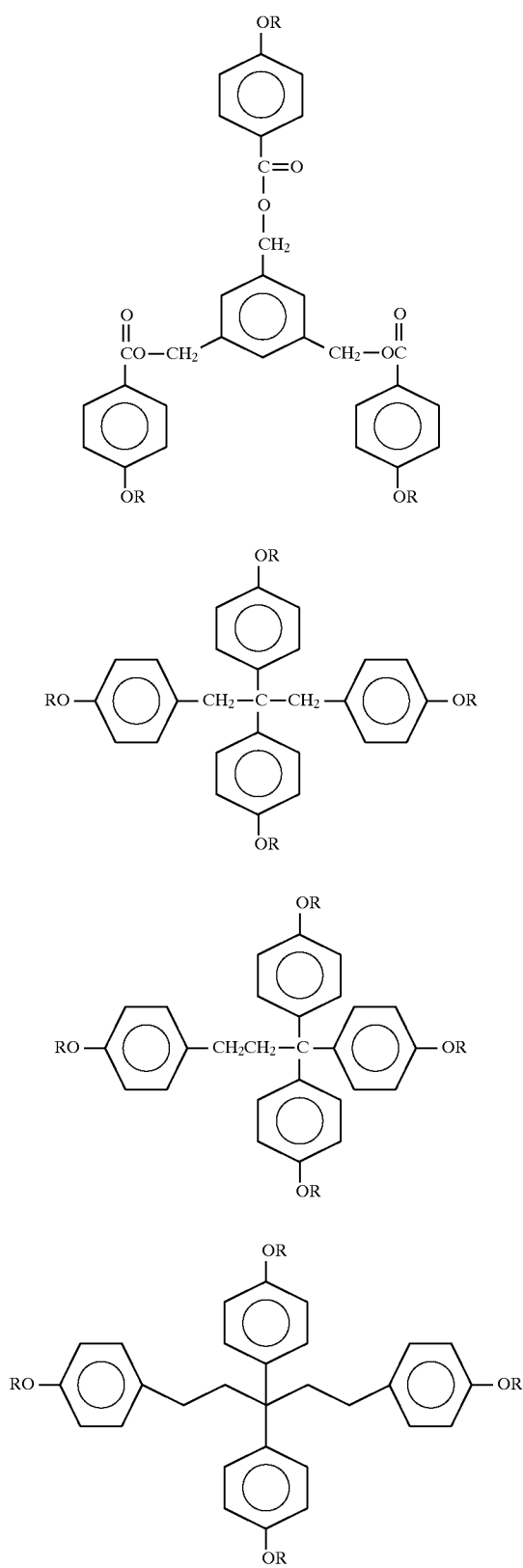
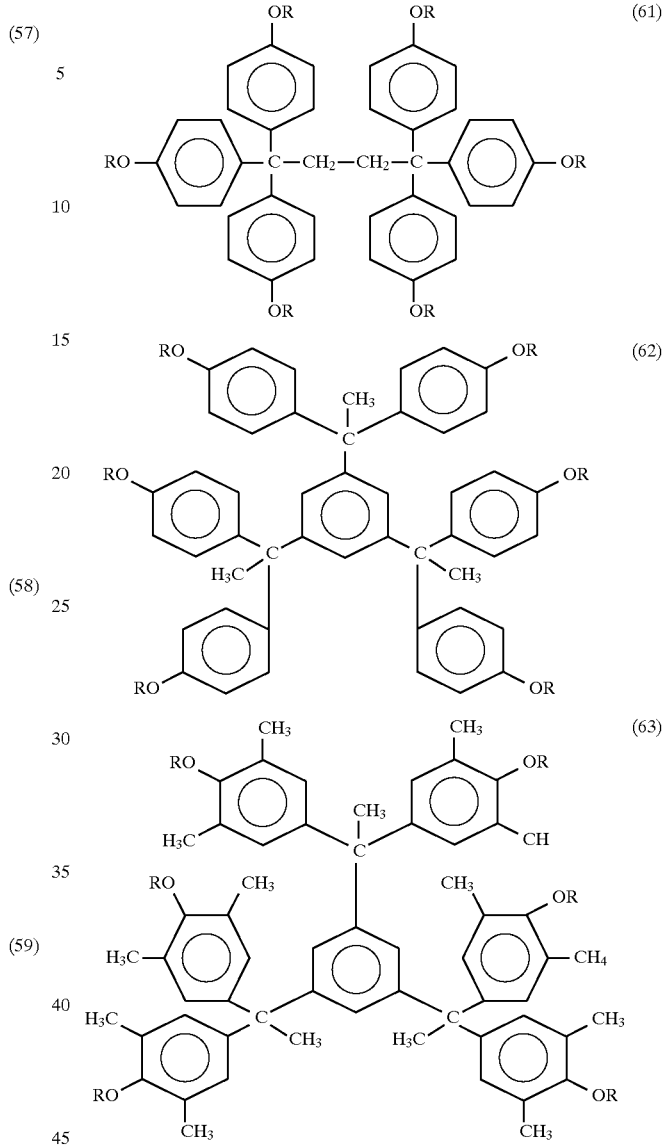

R groups in each of Compounds (1) to (63) are each a hydrogen atom, —CH₂—COO—C(CH₃)₂C₆H₅, —CH₂—COO—C₄H₉(t), —COO—C₄H₉(t) or tetrahydropyrane-2-yl, provided that at least two of the R groups, or three of them depending on the structural condition, are groups other than hydrogen atom. The substituents represented by R, other than hydrogen, may not be the same so far as they are included in the groups recited above.

The dissolution inhibiting compound as recited above is added in a proportion of from 3 to 45 weight %, preferably from 5 to 30 weight %, and more preferably from 10 to 20 weight %, based on the total weight of the photosensitive composition (excepting a coating solvent).

Furthermore, an alkali-soluble resin having no acid-decomposable group may be added to the present photosensitive composition for the purpose of solubility adjustment in an alkali.

Specific examples of such an alkali-soluble resin include a novolak resin, a hydrogenated novolak resin, an acetone-pyrogallol resin, a poly(o-hydroxystyrene), a poly(m-hydroxystyrene), a poly(p-hydroxystyrene), a hydrogenated poly(hydroxystyrene), a halogen- or alkyl-substituted poly (hydroxystyrene), a hydroxystyrene-N-substituted maleimide copolymer, o/p- and m/p-hydroxystyrene copolymers, a poly(hydroxystyrene) whose OH groups are partially alkylated (e.g., a poly(hydroxystyrene) whose OH groups are methylated in a proportion of 5–30 mole %), a poly (hydroxystyrene) whose OH groups are partially acylated (e.g., a poly(hydroxystyrene) whose OH groups are acetylated in a proportion of 5–30 mole %), a styrene-maleic anhydride copolymer, a styrene-hydroxystyrene copolymer, an α-methylstyrene-hydroxystyrene copolymer, a carboxyl group-containing methacrylic resin and derivatives thereof, but these examples should not be construed as limiting the scope of the present invention in any way.

Of those alkali-soluble resins, a novolak resin, a poly(o-hydroxystyrene), a poly(m-hydroxystyrene), a poly(p-hydroxystyrene), copolymers of these hydroxystyrenes, an alkyl-substituted poly(hydroxystyrene), a partially O-alkylated or O-acylated poly(hydroxystyrene), a styrene-hydroxystyrene copolymer and an α-methylstyrene-hydroxystyrene copolymer are preferred in particular. The novolak resin as cited above can be obtained using specified monomers as main component and subjecting them to the addition condensation reaction with aldehydes in the presence of an acidic catalyst.

As for the specified monomers, aromatic hydroxy compounds, such as phenol, cresols (e.g., m-cresol, p-cresol and o-cresol), xylenols (e.g., 2,5-xylenol, 3,5-xylenol, 3,4-xylenol and 2,3-xylenol), alkylphenols (e.g., m-ethylphenol, p-ethylphenol, o-ethylphenol, p-t-butylphenol, p-octylphenol and 2,3,5-trimethylphenol), alkoxyphenols (e.g., p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol and p-butoxyphenol), bisalkylphenols (e.g., 2-methyl-4-isopropylphenol), m-chlorophenol, p-chlorophenol, o-chlorophenol, dihydroxybiphenyl, bisphenol A, phenylphenol, resorcinol and naphthol, can be employed alone or as a mixture of two or more thereof. However, these examples should not be considered as limiting on the scope of the invention.

Specific examples of aldehydes which can be used include formaldehyde, paraformaldehyde, acetaldehyde, propionaldehyde, benzaldehyde, phenylacetaldehyde, α-phenylpropyl aldehyde, β-phenylpropyl aldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde and acetal compounds thereof, such as chloroacetaldehyde diethylacetal. Of these aldehydes, formaldehyde is used to particular advantage.

Those aldehydes can be used alone or as a mixture of two or more thereof. As for the acidic catalyst which can be used, hydrochloric acid, sulfuric acid, formic acid, acetic acid and oxalic acid are examples thereof.

It is desirable for the novolak resins obtained in the foregoing manner to have their weight-average molecular weight in the range of 1,000 to 30,000. When the weight-average molecular weight is below 1,000, a decrease of film thickness due to development is too great in the unexposed area; while, when it is increased beyond 30,000, the development speed becomes low. In particular, the range of 2,000 to 20,000 is appropriate for the weight-average molecular weight of a novolak resin used.

As for the above-recited alkali-soluble resins other than novolak resins, such as poly(hydroxystyrene)s, the derivatives thereof and hydroxystyrene copolymers, it is desirable for their weight-average molecular weight to be at least 2,000, preferably from 5,000 to 200,000, more preferably from 10,000 to 100,000. From the viewpoint of heightening heat resistance of a resist film, it is advantageous to such a resin to have a weight-average molecular weight of at least 25,000.

Additionally, the weight-average molecular weight is defined as the value determined by gel permeation chromatography on a polystyrene basis.

Those alkali-soluble resins as recited above may be used as a mixture of two or more thereof.

The present photosensitive composition can further contain other ingredients, such as a dye, a pigment, a plasticizer, a surfactant, a photosensitizer, an organic basic compound and a compound having at least two phenolic OH groups to promote dissolution in a developer, if needed.

As for the compound having at least two phenolic OH groups, phenolic compounds having molecular weight of no higher than 1,000 are advantageously used in the present invention. Although such a phenolic compound is required to have at least two phenolic OH groups in a molecule, it loses its effect on improvement in development latitude when the number of phenolic OH groups contained therein is increased beyond 10. Further, when the ratio between phenolic OH groups and aromatic ring(s) is less than 0.5 in the phenolic compound, the film thickness dependence shows an increasing tendency and the development latitude shows a decreasing tendency. In addition, it is also undesirable that the foregoing ratio is greater than 1.4, because the photosensitive composition containing such a phenolic compound undergoes deterioration in stability to make it difficult to achieve high resolution and satisfactory film thickness dependence.

For the phenolic compounds usable in the present invention, it is desirable to be added in a proportion of 2 to 50 weight %, preferably 5 to 30 weight %, to an alkali-soluble resin used together. The addition thereof in a proportion higher than 50 weight % is undesirable because it aggravates development-residue trouble and newly causes pattern deformation upon development.

Those phenolic compounds having molecular weight of no higher 1,000 can be prepared with ease by reference to the methods described in, e.g., JP-A-4-122938, JP-A-2-28531, U.S. Pat. No. 4,916,210 and European Patent 0,219, 294.

Specific examples of such a phenolic compound as mentioned above include the compounds recited below, but these examples are not to be considered as limiting on the scope of compounds usable in the present invention.

Specifically, those phenolic-compounds are resorcin, phloroglucin, 2,3,4-trihydroxybenzophenone, 2,3,4,4'-tetrahydroxybenzophenone, 2,3,4,3',4',5'-hexahydroxybenzophenone, acetone-pyrogallol condensed resin, phloroglucoside, 2,4,2',4'-tetrahydroxybiphenyl, 4,4'-thiobis(1,3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenyl sulfone, tris(4-hydroxyphenyl)methane, 1,1-bis(4-hydroxyphenyl) cyclohexane, 4,4-(α-methylbenzylidene)bisphenol, α,α',α"-tris(4-hydroxyphenyl)-1,3,5-triisopropylbenzene, α,α',α"-tris(4-hydroxyphenyl)-1-ethyl-4-isopropylbenzene, 1,2,2- tris(hydroxyphenyl)propane, 1,1,2-tris(3,5-dimethyl-4-hydroxyphenyl)propane, 2,2,5,5-tetrakis(4-hydroxyphenyl) hexane, 1,1,2,2-tetrakis(4-hydroxyphenyl)ethane, 1,1,3-tris (hydroxyphenyl)butane, para[α,α,α',α'-tetrakis(4-hydroxyphenyl)]xylene and the like.

The organic basic compounds which can be appropriately used in the present invention are compounds having stronger basicity than phenol. Of these compounds, nitrogen-containing basic compounds are used to greater advantage.

As examples of a desirable chemical environment of nitrogen atom(s) in such a basic compound, mention may be made of the structures represented by the following formulae (A) to (E):

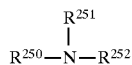
(A)

wherein $R^{250}$, $R^{251}$ and $R^{252}$ are identical to or different from one another, and each of them is a hydrogen atom, a 1-6C alkyl group, a 1-6C aminoalkyl group, a 1-6C hydroxyalkyl group, or a substituted or unsubstituted 6-20C aryl group, or $R^{251}$ and $R^{252}$ combine with each other to complete a ring;

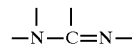
(B)

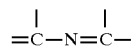
(C)

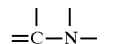
(D)

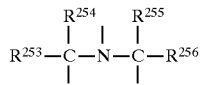
(E)

wherein $R^{253}$, $R^{254}$, $R^{255}$ and $R^{256}$ are identical to or different from one another, and each of them is a 1-6C alkyl group.

More appropriate nitrogen-containing basic compounds are those containing in a molecule at least two nitrogen atoms different in chemical environment. In particular, compounds having in a molecule both a substituted or unsubstituted amino group and a ring structure containing nitrogen atom(s) or compounds having alkylamino groups are preferred over others. As examples of an organic basic compound appropriate for the present invention, mention may be made of a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine, and a substituted or unsubstituted aminoalkylmorpholine. As for substituents suitable for the compounds as recited above, an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group are examples thereof. Specific examples of a particularly favorable basic compound include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperadine, N-(2-aminoethyl) piperadine, N-(2-aminoethyl)piperidine, 4-amino-2,2,6,6-tetramethylpiperidine, 4-piperizinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine. However, basic compounds usable in the present invention should not be construed as being limited to the compounds recited above.

Those nitrogen-containing basic compounds can be used alone or as a mixture of two or more thereof. The amount of nitrogen-containing basic compound(s) used is generally from 0.001 to 10 parts by weight, preferably from 0.01 to 5 parts by weight, per 100 parts by weight of the photosensitive composition (except a solvent). When such compounds are added in an amount less than 0.001 part by weight, they cannot bring about their effect; while, when the addition amount thereof is more than 10 parts by weight, they tend to lower the sensitivity and deteriorate the developability in unexposed areas.

As for suitable dyes, oil dyes and basic dyes are examples thereof. Specifically, Oil Yellow #101, Oil Yellow #103, Oil Pink #312, Oil Green BG, Oil Blue BOS, Oil Blue #603, Oil Black BY, Oil Black BS, Oil Black T-505 (which are products of Orient Kagaku Kogyo Co., Ltd.), Crystal Violet (CI42555), Methyl Violet (CI42535), Rhodamine B (CI45170B), Malachite Green (CI42000) and Methylene Blue (CI52015) can be used to advantage.

Further, the spectral sensitizers as recited below are added to induce sensitivity to the wavelengths at which the photoacid generator used has no spectral absorption, that is, wavelengths longer than far ultraviolet region, and thereby it becomes possible to confer the sensitivity to i-or g-line upon the present photosensitive composition. Specific examples of such a spectral sensitizer include benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzil, Acridine Orange, benzoflavin, Cetoflavin-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin) and coronene, but these examples should not be construed as limiting on the scope of spectral sensitizers usable in the invention.

In addition, those spectral sensitizers can be used as an absorbent for far ultraviolet rays of a light source. Such absorbents can reduce the reflected light from a substrate to lessen the influence of multiple reflection inside the resist film; as a result, an effect on stationary wave improvement can be produced.

The ingredients mentioned above are dissolved in a solvent to prepare the present photosensitive composition, and coated on a support. Suitable examples of a solvent used therein include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethylacetate, ethylene glycol monoethylether acetate, propylene glycol monomethyl ether, propylene glycol monomethylether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. These solvents are used alone or as a mixture of two or more thereof.

Also, a surfactant can be added to the solvent as recited above. Specific examples of such a surfactant include non-ionic surfactants, such as polyoxyethylene alkyl ethers (e.g., polyoxyethylene lauryether, polyoxyethylene stearyl ether, polyoxyethylene cetyl ether, polyoxyethylene oleyl ether), polyoxyethylene alkyl aryl ethers (e.g., polyoxyethylene octyl phenyl ether, polyoxyethylene nonyl phenyl ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate) and polyoxyethylene-sorbitan fatty acid esters (e.g., polyoxyethylenesorbitan monolaurate, polyoxyethylenesorbitan monopalmitate, polyoxyethylenesorbitan monostearate, polyoxyethylenesorbitan trioleate, polyoxyethylenesorbitan tristearate), fluorine-containing surfactants, such as Eftop EF301, EF303 and EF352 (commercial names, products of Shin-Akita Kasei K.K.), Megafac F171 and F173 (commercial names, products of Dai-Nippon Ink & Chemicals, Inc.), Florad FC430 and FC431 (commercial names, products of Sumitomo 3M Co., Ltd.), Asahiguard AG710, Surflon S-382, SC101, SC102, SC103, SC104, SC105 and SC106 (commercial names, products of Asahi Glass Company, Ltd.), organosiloxane polymers, such as KP341 (code name of Shin-etsu Chemical Co., Ltd.), and acrylic or methacrylic acid (co)polymers, such as Polyflow No. 75 and No. 95 (commercial names, products of Kyoeisha Yushi Kagaku Kogyo K.K.). The amount of those surfactants added is generally not greater than 2 parts by weight, preferably not greater than 1 part by weight, per 100 parts by weight of the total solids in the present composition.

Those surfactants may be added alone or as a mixture of two or more thereof.

The aforementioned photosensitive composition is coated on a substrate (e.g., silicon/silicon dioxide coating) as employed for the production of precise integrated circuit elements by the use of an appropriate coating means, e.g., a spinner, a coater or so on, exposed to light via a desired mask, baked and then developed to provide a satisfactory resist pattern.

The developer usable for the present photosensitive composition is an alkaline aqueous solution containing an inorganic alkali such as sodium hydroxide, potassium hydroxide, sodium carbonate, sodium silicate, sodium metasilicate or aqueous ammonia, a primary amine such as ethylamine or n-propylamine, a secondary amine such as diethylamine or di-n-butylamine, a tertiary amine such as triethylamine or methyldiethylamine, an alcohol amine such as dimethylethanolamine or triethanolamine, a quaternary ammonium salt such as tetramethylammonium hydroxide or tetraethylammonium hydroxide, or a cyclic amine such as pyrrole or piperidine.

To such an alkaline aqueous solution, an alcohol and a surfactant can be added in appropriate amounts.

The present invention will be illustrated below in more detail by the following examples, but the scope of the invention should not be construed as being limited by these examples.

Synthesis Example 1: Synthesis of Compound I-1

N-hydroxyphthalimide and benzenesulfonyl chloride were dissolved in amounts of 10.0 g and 10.8 g, respectively, in 100 ml of acetone, and thereto 6.5 g of triethylamine was added dropwise over a 20-minute period. The resultant solution was stirred for 2 hours at room temperature, and then poured into 500 ml of distilled water to yield a powdery matter. The powdery matter precipitated was filtered off, washed with water, and then dried. Thus, 18.2 g of Compound I-1 was obtained.

Synthesis Example 2: Synthesis of Compound I-2

N-hydroxyphthalimide and p-toluenesulfonyl chloride were dissolved in amounts of 10.0 g and 11.7 g, respectively, in 100 ml of acetone. To this solution, 6.5 g of triethylamine was added dropwise over a 20-minute period. The resultant solution was stirred for 2 hours at room temperature, and then poured into 500 ml of distilled water. The powdery matter thus precipitated was filtered off, washed with water, and then dried to yield crude crystals. These crystals were recrystallized from an ethanol/toluene mixture to give 17.3 g of Compound I-2.

Synthesis Example 3: Synthesis of Compound I-21

Hydroxylamine hydrochloride in an amount of 21.4 g was dissolved in 80 ml of distilled water. To this solution, 12.3 g of NaOH dissolved in 50 ml of distilled water was added over a period of 30 minutes as the solution was cooled in an ice bath. Thereto, 50.0 g of 4-methylphthalic anhydride was further added, and stirred for 1 hour at room temperature, followed by 4-hour reflux. The reaction solution was cooled in an ice bath, and the powdery matter thus precipitated was filtered off and washed with water. The resultant crude crystals were recrystallized from an acetone/water mixture to give 27.0 g of 4-methyl-N-hydroxyphthalimide.

A 0.53 g portion of the 4-Methyl-N-hydroxyphthalimide and 0.62 g of 4-methoxybenzenesulfonyl chloride were dissolved in 30 ml of acetone, and thereto 0.32 g of triethylamine was added dropwise over a 10-minute period. The resultant solution was stirred for 2 hours at room temperature, and poured into 150 ml of distilled water to precipitate a powdery matter. This powdery matter was filtered off, washed with water, and dried. Thus, 1.0 g of Compound I-21 was obtained.

The present other sulfonates of N-hydroxyimides were synthesized by reacting the corresponding N-hydroxyimides with the corresponding sulfonic acid chlorides in the presence of a base in a manner similar to the above.

Synthesis Example 4: Synthesis of Comparative Acid Generator

2-Cyclohexylcarbonyl-2-(p-toluenesulfonyl)propane (PAG-Y) was prepared using the method described in JP-A-5-249682.

Synthesis Example 5: Resin Synthesis 1

A solution containing 48 g of poly(p-hydroxystyrene) [weight-average molecular weight: 11,000] in 250 ml of dehydrated THF was admixed with 23.3 g of t-butylvinyl ether and 0.1 g of dehydrated p-toluenesulfonic acid, and stirred for 4 hours at room temperature. The resultant reaction solution was poured into a solution containing 3 g of triethylamine in 3 liter of ion-exchange purified water. The powdery matter thus precipitated was filtered off, washed with water, and dried to give a p-hydroxystyrene/p-(1-t-butoxyethoxystyrene) (50/50) copolymer [weight-average molecular weight: 13,000].

Synthesis Example 6: Resin Synthesis 2

A solution containing 48 g of poly(p-hydroxystyrene) [weight-average molecular weight: 11,000] in 250 ml of dehydrated THF was admixed with 14.0 g of t-butylvinyl ether, 0.96 g of 2,2-bis(4-hydroxycyclohexyl)propane and 0.1 g of dehydrated p-toluenesulfonic acid, and stirred for 24 hours at room temperature. The resultant reaction solution was poured into a solution containing 3 g of triethylamine in 3 liter of ion-exchange purified water. The powdery matter thus precipitated was filtered off, washed with water, and dried to give a partially crosslinked p-hydroxystyrene/p-(1-t-butoxyethoxystyrene) copolymer [weight-average molecular weight: 18,000].

Synthesis Example 7: Resin Synthesis 3

A p-hydroxystyrene/p-(2-tetrahydropyranyloxy)styrene (50/50) copolymer [weight-average molecular weight: 13,000] was synthesized in the same manner as in Resin Synthesis 1, except that 2,3-dihydroxy-4H-pyrane was used in place of t-butylvinyl ether.

Synthesis Example 8: Resin Synthesis 4

Di-t-butyl dicarbonate in an amount of 1.6 g was added to a solution containing poly(p-hydroxystyrene) [weight-average molecular weight: 11,000] in 40 ml of pyridine while stirring at room temperature. Therein, the reaction was run for 3 hours at room temperature, and the resultant solution was poured into a solution containing 20 g of conc. hydrochloric acid in 1 liter of ion-exchanged water. A powdery matter thus precipitated was filtered off, washed with water, and dried to give a p-hydroxystyrene/p-(t-butyloxycarbonyloxy)styrene (50/50) copolymer.

Synthesis Example 9: Resin Synthesis 5

In a similar manner as used in Resin Synthesis 1, a p-hydroxystyrene/p-(1-cyclohexyloxyethoxy)styrene (50/50) copolymer [weight-average molecular weight: 13,000] and p-hydroxystyrene/p-(1-ethoxyethoxy)styrene (50/50) copolymer [weight-average molecular weight: 12,000] were synthesized respectively.

Synthesis Example 10: Resin Synthesis 6

A solution containing 500 g of poly(p-hydroxystyrene) [VP-8000 manufactured by Nippon Soda Co., Ltd.; weight-average molecular weight: 11,000] in 2000 ml of dehydrated THF was admixed with 176 g of iso-butylvinyl ether and 0.15 g of dehydrated p-toluenesulfonic acid, and stirred for 10 hours at room temperature. The resultant reaction solution was poured into a solution containing 16 g of triethylamine in 40 liter of ion-exchanged water. The powdery matter thus precipitated was filtered off, washed with water, and dried to give a p-hydroxystyrene/p-(1-iso-butoxyethoxystyrene) (60/40) copolymer [weight-average molecular weight: 12,000].

Synthesis Example 11: Resin Synthesis 7

A solution containing 500 g of poly(p-hydroxystyrene) [VP-8000 manufactured by Nippon Soda Co., Ltd.; weight-average molecular weight: 11,000] in 2000 ml of dehydrated THF was admixed with 166 g of iso-butylvinyl ether, 40 g of 2,2-bis(4-hydroxycyclohexyl)propane and 0.15 g of dehydrated p-toluenesulfonic acid, and stirred for 10 hours at room temperature. The resultant reaction solution was poured into a solution containing 16 g of triethylamine in 40 liter of ion-exchanged water. The powdery matter thus precipitated was filtered off, washed with water, and dried to give a partially crosslinked p-hydroxystyrene/p-(1-iso-butoxyethoxystyrene) (70/30) copolymer [weight-average molecular weight: 96,000].

Synthesis Example 12: Dissolution Inhibitor Synthesis I

A solution containing 20 g of $\alpha,\alpha',\alpha''$-tris(4-hydroxyphenyl)-1,3,5-triisopropylbenzene in 400 ml of tetrahydrofuran was admixed with 14 g of potassium tert-butoxide in an atmosphere of nitrogen, and stirred for 10 minutes at room temperature. Then, 29.2 g of di-tert-butyl dicarbonate was further added thereto. In the resultant solution, the reaction was run for 3 hours at room temperature. The reaction mixture thus obtained was poured into ice-cold water, followed by extraction of the reaction product with ethyl acetate. Further, the ethyl acetate layer was washed with water, dried and then distilled to remove the solvent. The crystalline solid obtained was recrystallized from diethyl ether, and dried. Thus, 25.6 g of Compound (31) (all R groups=t-BOC) was obtained.

Synthesis Example 13: Dissolution Inhibitor Synthesis 2

1-[$\alpha$-Methyl-$\alpha$-(4'-hydroxyphenyl)ethyl]-4-[$\alpha',\alpha'$-bis(4"-hydroxyphenyl)ethyl]benzene in an amount of 42.4 g (0.10 mole) was dissolved in 300 ml of N,N-dimethylacetamide, and thereto 49.5 g (0.35 mole) of potassium carbonate and 84.8 g (0.33 mole) of cumyl bromoacetate were added. The resulting solution was stirred for 7 hours at 120° C. The reaction mixture obtained was poured into 2 l of ion-exchanged water, neutralized with acetic acid, and then extracted with ethyl acetate. The extract obtained was concentrated, and purified by column chromatography. Thus, 70 g of Compound (18) (all R groups=—$CH_2COOC(CH_3)_2C_6H_5$) was obtained.

Synthesis Example 14: Dissolution Inhibitor Synthesis 3

To a solution containing 44 g of 1,3,3,5-tetrakis(4-hydroxyphenyl)pentane in 250 ml of N,N-dimethylacetamide, 70.7 g of potassium carbonate was added first, and then 90.3 g of t-butyl bromoacetate was added. The resultant mixture was stirred for 7 hours at 120° C. The reaction mixture obtained was poured into 2 liter of ion-exchanged water to yield a viscous matter. The viscous matter was washed with water, and purified by column chromatography. Thus, 87 g of Compound (60) (all R groups=—$CH_2$—COO—$C_4H_9(t)$ ) was obtained.

Synthesis Example 15: Dissolution Inhibitor Synthesis 4

To a solution containing 20 g of $\alpha,\alpha,\alpha',\alpha',\alpha'',\alpha''$-hexakis(4-hydroxyphenyl)-1,3,5-triethylbenzene in 400 ml of diethyl ether, 42.4 g of 3,4-dihydro-2H-pyrane and a catalytic amount of hydrochloride acid were added in an atmosphere of nitrogen. The resultant mixture was refluxed for 24 hours. At the conclusion of the reaction, the reaction mixture was admixed with a small amount of sodium hydroxide, and filtered. The filtrate obtained was concentrated, and purified by column chromatography to yield 55.3 g of Compound (62) (all R groups=THF).

EXAMPLES 1–11 AND COMPARATIVE EXAMPLES 1–3

Photosensitive compositions were prepared using the present compounds obtained in the foregoing Synthesis Examples. The formulae adopted therein are shown in Table 1.

TBE: $-O-CH_2-COO-C_4H_9(t)$

THP: 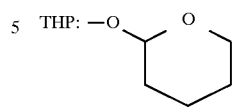

CE: 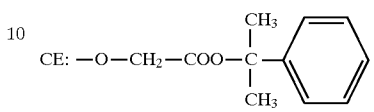

TABLE 1

Formulae of Photosensitive Compositions

| | Photoacid generator | Amount added | Resin | Amount added | Dissolution inhibitor | Amount added | Acid-decomposable group |
|---|---|---|---|---|---|---|---|
| Example 1 | (I-2) | 0.10 g | PHS/tBES | 1.90 g | — | | — |
| Example 2 | (I-5) | 0.10 g | PHS/tBESB | 1.90 g | — | | — |
| Example 3 | (I-9) | 0.10 g | PHS/iBES | 1.60 g | Dissolution inhibitor (60) | 0.30 g | TBE |
| Example 4 | (I-11) | 0.10 g | PHS/tBESB | 1.90 g | — | | — |
| Example 5 | (I-14) | 0.10 g | PHS/EES | 1.90 g | — | | — |
| Example 6 | (I-18) | 0.10 g | PHS/EES | 1.60 g | Dissolution inhibitor (62) | 0.30 g | THP |
| Example 7 | (I-19) | 0.10 g | PHS/THPS | 1.90 g | — | | — |
| Example 8 | (I-21) | 0.10 g | PHS/THPS | 1.90 g | — | | — |
| Example 9 | (I-28) | 0.10 g | PHS/THPS | 1.60 g | Dissolution inhibitor (31) | 0.30 g | TBOC |
| Example 10 | (I-42) | 0.10 g | PHS/CHES | 1.90 g | — | | — |
| Example 11 | (I-43) | 0.10 g | PHS/CHES | 1.60 g | Dissolution inhibitor (18) | 0.30 g | TBE |
| Comparative Example 1 | PAG-Y | 0.10 g | PHS/EES | 1.90 g | — | | — |
| Comparative Example 2 | (I-2) | 0.10 g | PHS/tBOCS | 1.90 g | — | | — |
| Comparative Example 3 | $Ph_3S^+CF_3SO_3^-$ | 0.10 g | PHS/BES | 1.90 g | — | | — |

<Resin>

PHS/iBES   p-hydroxystyrene/p-(1-iso-butoxyethoxy)styrene (60/40 by mole) copolymer
PHS/iBESB  p-hydroxystyrene/p-(1-iso-butoxyethoxy)styrene (70/30 by mole; partially crosslinked type) copolymer
PHS/tBES   p-hydroxystyrene/p-(1-t-butoxyethoxy)styrene (60/40 by mole) copolymer
PHS/tBESB  p-hydroxystyrene/p-(1-t-butoxyethoxy)styrene (70/30 by mole; partially crosslinked type) copolymer
PHS/EES    p-hydroxystyrene/p-(1-ethoxyethoxy)styrene (55/45 by mole) copolymer
PHS/EESB   p-hydroxystyrene/p-(1-ethoxyethoxy)styrene (55/45 by mole; partially crosslinked type) copolymer
PHS/THPS   p-hydroxystyrene/p-(2-tetrahydropyranyloxy)styrene (60/40 by mole) copolymer
PHS/tBOCS  p-hydroxystyrene/p-(t-butyloxycarbonyloxy)styrene (60/40 by mole) copolymer
PHS/CHES   p-hydroxystyrene/p-(1-cyclohexyloxyethoxy)styrene (50/50 by mole) copolymer <Acid-decomposable group in dissolution inhibitor>

TBOC:      $-O-COO-C_4H_9(t)$

Evaluation of Photosensitive Compositions

Each of the photosensitive compositions shown in Table 1 was admixed with 0.02 g of 4-dimethylaminopyridine, dissolved in 9.5 g of propylene glycol monomethylether acetate, and then passed through a 0.2 μm filter, thereby preparing a resist solution. This resist solution was coated on a silicon wafer by means of a spin coater, and dried for 90 seconds at 110° C. on a hot plate of vacuum adsorption type, thereby forming a 0.83 μm-thick resist film.

Each of the thus formed resist films was exposed by means of a 248 nm KrF excimer laser stepper (NA=0.42). Immediately after the exposure, each resist film was heated for 60 seconds with a 100° C. hot plate of vacuum adsorption type, followed at once by 60-second dipping in a 2.38% water solution of tetramethylammonium hydroxide (TMAH). Further, it was rinsed with water for 30 seconds, and then dried. The patterns thus formed on the silicon water were examined for profile, sensitivity and resolution, and evaluated by the following criteria. With respect to these characteristics, comparison was made between the present and comparative photosensitive compositions. The results obtained are shown in Table 2.

[Profile]

The shape of each pattern on the silicon wafer was observed under a scanning electron microscope, and thereby the resist profile was evaluated.

[Sensitivity]

The sensitivity was defined as the exposure amount required for the reproduction of a 0.40 μm mask pattern.

[Resolution]

The resolution was represented by the limiting resolution under the exposure amount required for the reproduction of a 0.40 μm mask pattern.

On the other hand, another piece of each resist film exposed in the aforementioned manner was allowed to stand for 2 hours, and then heated under the same condition as described above. Immediately after the heating, it was dipped in a 2.38% water solution of tetramethylammonium hydroxide (TMAH) for 60 seconds, rinsed with water for 30 seconds, and then dried. The line width of the thus formed pattern corresponding to a 0.35 μm mask pattern was measured, and compared with that in the foregoing case where the heating treatment was performed just after the exposure. Specifically, the percentage of a change in line-width due to the passage of time from the exposure to the heating treatment was calculated. The results obtained are also set forth in Table 2.

Additionally, the figures showing "Change in line width due to a 2-hour passage after exposure" in Table 2 are determined by the following equation:

Change in line width due to a 2-hour passage after exposure={[(Line width in the case of development carried out just after exposure)−(Line width in the case of development carried out after a 2-hour passage from the exposure)]/(Line width in the case of development carried out just after exposure)}×100

Storage Stability of Resist Solution

Resist solutions were prepared according to the formulae shown in Table 3, wherein the resins used were respectively the p-hydroxystyrene/p-(1-ethoxyethoxy) styrene (50/50) copolymer (abbreviated as "PHS/EES") synthesized in Synthesis Example 9 and the p-hydroxystyrene/p-(2-(2-methoxy)propyloxy)styrene (50/50) copolymer (abbreviated as "PHS/MPS") synthesized by the same method as described in JP-A-7-140666. Just after the preparation and after a 3-month storage in an atmosphere of nitrogen at 5° C., respectively, each of these resist solutions was examined for sensitivity and resolution in the same manners as in the aforementioned Examples.

TABLE 2

Evaluation Results

|  | Sensitivity (mJ/cm²) | Resolution (μm) | Resist Pattern Profile | | Change in Line Width due to 2-Hour Passage after Exposure |
| --- | --- | --- | --- | --- | --- |
|  |  |  | Just after Exposure | After 2-Hour Passage |  |
| Example 1 | 29 | 0.28 | rectangle | rectangle | 0 |
| Example 2 | 24 | 0.30 | rectangle | rectangle | 0.6 |
| Example 3 | 26 | 0.26 | rectangle | rectangle | 1.2 |
| Example 4 | 25 | 0.26 | rectangle | rectangle | 0.9 |
| Example 5 | 25 | 0.27 | rectangle | rectangle | 1.6 |
| Example 6 | 29 | 0.27 | rectangle | rectangle | 1.4 |
| Example 7 | 26 | 0.30 | rectangle | rectangle | 0.3 |
| Example 8 | 23 | 0.30 | rectangle | rectangle | 2.0 |
| Example 9 | 29 | 0.31 | rectangle | rectangle | 1.8 |
| Example 10 | 22 | 0.28 | rectangle | rectangle | 0 |
| Example 11 | 21 | 0.27 | rectangle | rectangle | 0.8 |
| Comparative Example 1 | 30 | 0.32 | rectangle | rectangle | 18.2 |
| Comparative Example 2 | 32 | 0.33 | rectangle | no pattern formation | impossible to calculate |
| Comparative Example 3 | 29 | 0.34 | rectangle | rectangle | 22.5 |

TABLE 3

| | | | | Sensitivity (mJ/cm²) | | Resolution (μm) | |
| --- | --- | --- | --- | --- | --- | --- | --- |
| Resin | Acid generator | DMAP | PGMEA | Just after preparation | After 3-month storage | Just after preparation | After 3-month storage |
| PHS/EES 1.9 g | (I-2) 0.1 g | 0.02 g | 9.5 g | 27 | 27 | 0.31 | 0.31 |
| PHS/MPS 1.9 g | (I-2) 0.1 g | 0.02 g | 9.5 g | 29 | * | 0.32 | * |

*: No pattern formation
PGMEA: Propylene glycol methylether acetate
DMPA: 4-Dimethylaminopyridine It can be seen from the results shown in Table 2 and Table 3 that the resist films according to the present invention formed patterns having a satisfactory profile and had high sensitivity and high resolution, and what is more, the resist patterns formed therein suffered a slight change in line width due to lapse of time after exposure, compared with those formed in the comparative resist films. Further, the positive working photosensitive composition according to the present invention proved to have excellent storage stability.

The positive working photosensitive composition of the present invention can provide a positive photoresist composition of chemical amplification type which forms resist patterns having a satisfactory profile and has high sensitivity, high resolution, slight change in properties with a lapse of time after exposure and excellent storage stability.

What is claimed is:

1. A positive working photosensitive composition comprising (a) a compound represented by the following formula (I) which generates a sulfonic acid by irradiation with active rays or radiation, and (b) at least 60 weight percent, based on the total weight of the photosensitive composition, of a resin comprising consitutional repeating units of the following formulae (II) and (III) and having in an alkali developer through their decomposition due to the action of an acid:

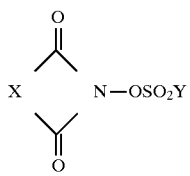
(I)

wherein Y represents an optionally substituted straight-chain, branched, or cyclic alkyl group, an optionally substituted aralkyl group, or a group illustrated below;

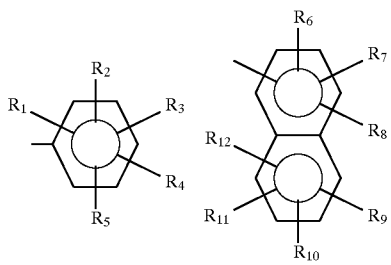

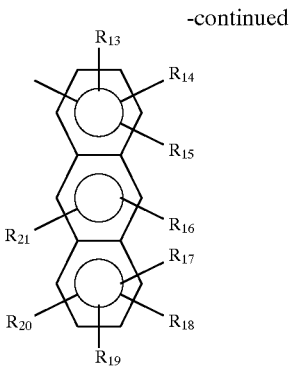
-continued wherein the substituent groups from $R_1$ to $R_{21}$ are the same or different, and each is a hydrogen atom, an optionally substituted straight-chain, branched, or cyclic alkyl group, an optionally substituted alkoxy group, an acyl group, a formyl group, a nitro group, an acylamino group, a sulfonylamino group, an optionally substituted aryl group, an optionally substituted alkoxycarbonyl group, a chlorine atom, a bromine atom, an iodine atom, a hydroxyl group, a cyano group, an acyloxy group, or an optionally substituted aralkyl group; optional two of the substituent groups from $R_1$ to $R_5$, from $R_6$ to $R_{12}$, and from $R_{13}$ to $R_{21}$, respectively, may combine to complete a 5- to 8-membered ring composed of a carbon atom and/or a hetero atom; Y may be bonded to the other imidesulfonate compound residue; and X represents an optionally substituted straight-chain or branched alkylene group, an optionally substituted monocyclic or polycyclic aklylene group which may contain a hetero atom, an optionally substituted straight-chain or branched alkenylene group, an optionally substituted monocyclic or polycyclic alkenylene group which may contain a hetero atom, an optionally substituted arylene group, or an optionally substituted aralkylene group, and X may be bonded to the other imidesulfonate compound residue:

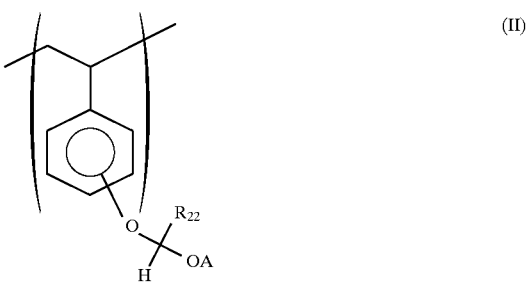
(II)

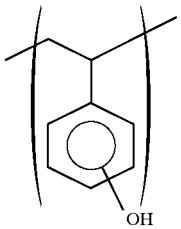

wherein $R_{22}$ represents a hydrogen atom, an optionally substituted straight-chain, branched or cyclic alkyl group, or an optionally substituted straight-chain, branched or cyclic alkyl group, or an optionally substituted aralkyl group; and A represents an optionally substituted straight-chain, branched or cyclic alkyl group, or an optionally substituted aralkyl group; and A may combine with $R_{22}$ to complete a 5- or 6-membered ring.

2. The positive working photosensitive composition according to claim 1, further comprising (c) a low molecular, acid-decomposable, dissolution-inhibiting compound which has a molecular weight of no greater than 3,000, contains groups capable of being decomposed by an acid and increases the solubility in an alkali developer due to the action of the acid.

3. The positive working photosensitive composition according to claim 1, wherein the proportion of the compound represented by formula (I) in the total composition is from 0.1 to 20 weight % on a solids basis.

4. The positive working photosensitive composition according to claim 1, wherein the proportion of the compound represented by formula (I) in the total composition is from 0.5 to 10 weight % on a solids basis.

5. The positive working photosensitive composition according to claim 1, wherein the proportion of the compound represented by formula (I) in the total composition is from 1 to 7 weight % on a solids basis.

6. The positive working photosensitive composition according to claim 1, wherein the resin is used in a proportion of from 60 to 99 weight % to the total weight of the photosensitive composition.

7. The positive working photosensitive composition according to claim 1, wherein the resin is used in a proportion of from 60 to 95 weight % to the total weight of the photosensitive composition.

8. The positive working photosensitive composition according to claim 2, wherein the dissolution inhibiting compound is added in a proportion of from 3 to 45 weight % based on the total weight of the photosensitive composition (excepting a coating solvent).

9. The positive working photosensitive composition according to claim 2, wherein the dissolution inhibiting compound is added in a proportion of from 5 to 30 weight % based on the total weight of the photosensitive composition (excepting a coating solvent).

10. The positive working photosensitive composition according to claim 2, wherein the dissolution inhibiting compound is added in a proportion of from 10 to 20 weight % based on the total weight of the photosensitive composition (excepting a coating solvent).

* * * * *